US010897230B2

(12) United States Patent
Tanoi et al.

(10) Patent No.: US 10,897,230 B2
(45) Date of Patent: Jan. 19, 2021

(54) BIAS CIRCUIT AND AMPLIFICATION APPARATUS

(71) Applicant: Tohoku University, Miyagi (JP)

(72) Inventors: Satoru Tanoi, Miyagi (JP); Tetsuo Endoh, Miyagi (JP)

(73) Assignee: TOHOKU UNIVERSITY, Miyagi (JP)

(*) Notice: Subject to any disclaimer, the term of this patent is extended or adjusted under 35 U.S.C. 154(b) by 79 days.

(21) Appl. No.: 16/348,618

(22) PCT Filed: Nov. 6, 2017

(86) PCT No.: PCT/JP2017/039992
§ 371 (c)(1),
(2) Date: Aug. 21, 2019

(87) PCT Pub. No.: WO2018/088373
PCT Pub. Date: May 17, 2018

(65) Prior Publication Data
US 2019/0372527 A1 Dec. 5, 2019

(30) Foreign Application Priority Data
Nov. 10, 2016 (JP) .................... 2016-220073

(51) Int. Cl.
H03F 1/02 (2006.01)
H03F 3/45 (2006.01)
(Continued)

(52) U.S. Cl.
CPC ............ *H03F 1/0261* (2013.01); *G05F 1/46* (2013.01); *H02M 3/07* (2013.01); *H03F 1/0211* (2013.01);
(Continued)

(58) Field of Classification Search
USPC .............. 330/277, 285, 296–298, 289, 310
See application file for complete search history.

(56) References Cited

U.S. PATENT DOCUMENTS 7,471,152 B2 * 12/2008 Jiang .................. G01R 31/2884
327/539
8,513,938 B2 * 8/2013 Tachibana ................ G05F 3/30
323/315

FOREIGN PATENT DOCUMENTS

JP   S63189916 A   8/1988
JP   H05289760 A   11/1993
(Continued)

OTHER PUBLICATIONS

Tanoi et al.:"A High Output Resistance 1.2-V VDD Current Mirror with Deep Submicron Vertical MOSFETs", IEICE Trans. Electron., vol. E97-C, No. 5, May 2014.
(Continued)

*Primary Examiner* — Hieu P Nguyen
(74) *Attorney, Agent, or Firm* — Fox Rothschild LLP; Robert J. Sacco; Carol E. Thorstad-Forsyth

(57) ABSTRACT

An amplification apparatus includes a bias circuit for supplying a bias voltage, and an amplification circuit to which the bias voltage is supplied from the bias circuit. The bias circuit includes a first current source for increasing/decreasing a first current depending on the bias voltage, and a first MOSFET with first polarity through which the first current flows, to output a first voltage from a connection between the first current source and the first MOSFET; a second current source for outputting a constant current as a second current, and a second MOSFET with second polarity through which the second current flows, to output a second voltage from a connection between the second current source and the second MOSFET; and a voltage comparator for increasing/decreasing the bias voltage such that the first and second voltages become equal, based on a difference between the first and second voltages.

13 Claims, 19 Drawing Sheets

(51) Int. Cl.
*H03F 3/343* (2006.01)
*H03G 3/30* (2006.01)
*H02M 3/07* (2006.01)
*G05F 1/46* (2006.01)

(52) U.S. Cl.
CPC ......... *H03F 3/343* (2013.01); *H03F 3/45071* (2013.01); *H03G 3/30* (2013.01)

(56) References Cited

FOREIGN PATENT DOCUMENTS

| | | |
|---|---|---|
| JP | 2001028540 A | 1/2001 |
| JP | 2002185272 A | 6/2002 |
| JP | 2009080786 A | 4/2009 |
| JP | 2010206578 A | 9/2010 |
| JP | 2013243614 A | 12/2013 |
| WO | 2011043402 A1 | 4/2011 |

OTHER PUBLICATIONS

Razavi: "Design of Analog CMOS Integrated Circuits", Advanced Edition, Maruzen Co., Ltd., Mar. 20, 2003.
English Translation of International Preliminary Report on Patentability dated Mar. 29, 2019 in PCT/JP2017/039992 filed on Nov. 6, 2017.

* cited by examiner

BIAS CIRCUIT AND AMPLIFICATION APPARATUS

CROSS REFERENCE TO RELATED APPLICATIONS

This application is a § 371 U.S. National Phase Entry of International Patent Application No. PCT/JP2017/039992, filed on Nov. 6, 2017, which claims priority to and the benefit of Japanese Patent Application No. 2016-220073, filed on Nov. 10, 2016, the entireties of which are hereby incorporated herein by reference.

TECHNICAL FIELD

The present invention relates to a bias circuit and an amplification apparatus.

BACKGROUND ART

There is known a rail-to-rail type differential amplification apparatus capable of operating with an input voltage from a ground level to a power source voltage. As an example, a configuration of an amplification apparatus described in Patent Literature 1 is shown in FIG. 20. In FIG. 20, an amplification apparatus 60 includes a bias circuit 61, and a level shifter 62 and a differential amplification stage 63 that constitute an amplification circuit.

The bias circuit 61 includes a transistor P61, which is a p-type MOSFET, and a constant current source CS, the transistor P61 and the constant current source CS being connected in series. The level shifter 62 includes a pair of source follower stages 62n and 62p. In the source follower stages 62n and 62p, transistors P71n and P71p and transistors P72n and P72p as current sources are connected in series, respectively, between a power supply terminal (VDD) and the ground, small-amplitude differential input signals INN, INP being inputted to gates of the transistors P71n and P71p, respectively. All of the transistors P71n and P71p and the transistors P72n and P72p are p-type MOSFETs.

Gates of the above transistors P72n and P72p are connected to a gate of the transistor P61 and constitute a current mirror circuit together with the transistor P61. That is, a gate voltage of the transistor P61 is supplied to the level shifter 62 as a bias voltage, and the bias voltage is given as a gate voltage for the transistors P72n and P72p. Thereby, a drain current with the same absolute value as that of an output current of the constant current source CS is flown through the transistors P71n and P71p. The differential amplification stage 63 includes transistors P73 and P74 constituting a current mirror circuit, transistors N73 and N74 and a constant current source 75, output signals from the source follower stages 62n and 62p being inputted to gates of the transistors N73 and N74, respectively. The transistors P73 and P74 are p-type MOSFETs, and the transistors N73 and N74 are n-type MOSFETs.

Patent Literature 2 proposes a charge pump circuit that is not dependent on a power source voltage and reduces temperature dependence. In FIG. 21 showing a configuration of the charge pump circuit described in Patent Literature 2, a charge pump circuit 80 includes a constant voltage source 81, a constant current source 82, first and second current mirror circuits 83 and 84, and transistors P85 and N86 to which signals 1 and 2, which are control signals, are inputted. In this charge pump circuit 80, an output voltage from the constant voltage source 81 having a negative temperature coefficient is inputted to a gate of a transistor N87, one of transistors constituting a differential pair of a differential amplification circuit in the constant current source 82, and an inter-terminal voltage of a resistance element 91 with a negative temperature coefficient is inputted to a gate of a transistor N88, the other transistor. In the constant voltage source 81, each of a gate and a drain of a transistor P92 is connected to the ground, and a source of the transistor P92 is connected to a constant current source 94 via a resistance 93. An electric potential at a connection point between the resistance 93 and the constant current source 94 is outputted as an output voltage that is not dependent on a power source voltage. By using a polysilicon resistance having a negative temperature coefficient as the resistance element, temperature dependence of the output voltage is reduced. As the transistors of the charge pump circuit 80, n-type and p-type MOSFETs are used.

Furthermore, a vertical BC (body channel)-MOSFET is described in Non Patent Literature 1. In the vertical BC-MOSFET, a gate oxide film and a gate electrode are provided in a manner of surrounding a central part of a semiconductor pillar; the central part of the semiconductor pillar is a semiconductor region to be a channel; and a drain region and a source region are provided on both ends of the semiconductor pillar.

CITATION LIST

Patent Literature

Patent Literature 1: Japanese Patent Laid-Open No. 2010-206578
Patent Literature 2: Japanese Patent Laid-Open 2001-28540

Non Patent Literature

Non Patent Literature 1: Satoru Tanoi and Tetsuo Endoh "A High Output Resistance 1.2-V VDD Current Mirror with Deep Submicron Vertical MOSFETs" IEICE Transactions on Electronics, E97-C(5), (2014), 423-430

SUMMARY OF INVENTION

Technical Problem

Though an amplification apparatus as described above is required to output a predetermined output voltage corresponding to an input signal level, the amplification apparatus is susceptible to the influence of variation of MOSFETs constituting the amplification apparatus due to a manufacturing process of the MOSFETs, that is, threshold voltage variation due to process variation. As the process variation, variation of a gate width, a gate length, a film thickness of a gate oxide film and a dose mount to each of a channel region, a source region and a drain region, and the like for the MOSFETs are given. Especially, if polarities (p-type, n-type) of such a MOSFET that an input signal is inputted at a source follower stage and a MOSFET in an amplification stage to which an output from the source follower stage is inputted are different as shown in the circuit of Patent Literature 1, there is a problem that, if current characteristics of the MOSFETs with the p-type and n-type polarities fluctuate in an inverse correlation such that an absolute value of a threshold voltage of a MOSFET with one polarity is smaller than a standard value, and an absolute value of a threshold voltage of a MOSFET with the other polarity is larger than the standard value, deviation of an output voltage is large. The present invention has been made in view of the above situation, and an object of the invention is to provide a bias circuit for supplying a bias voltage suppressing influence of process variation to an amplification circuit, and an amplification apparatus using the bias circuit.

Solution to Problem

A bias circuit of the present invention is a bias circuit for supplying a bias voltage to an amplification circuit. The amplification circuit includes a transistor being a MOSFET with a first polarity and a transistor being a MOSFET with a second polarity different from the first polarity. The bias circuit includes a first voltage outputting unit, a second voltage outputting unit, and a voltage comparator. The first voltage outputting unit includes: a first current source configured to increase and decrease an output current depending on the bias voltage; and a first voltage dropping portion including a first transistor which is a MOSFET with the first polarity and through which the output current from the first current source flows as a drain current. The first voltage outputting unit is configured to output a first output voltage from a connection point between the first current source and the first voltage dropping portion. The second voltage outputting unit includes: a second current source configured to output a constant current; and a second voltage dropping portion including a second transistor which is a MOSFET with the second polarity and through which an output current from the second current source flows as a drain current. The second voltage outputting unit is configured to output a second output voltage from a connection point between the second current source and the second voltage dropping portion. The voltage comparator is configured to output the bias voltage, and increase and decrease the bias voltage such that the first and second output voltages become equal, based on a difference between the first and second output voltages.

An amplification apparatus of the present invention includes the above-described bias circuit, and the amplification circuit to which the bias voltage is configured to be supplied from the bias circuit. The amplification circuit includes a source follower stage and an amplification stage. The source follower stage includes: a third current source configured to increase and decrease an output current depending on the bias voltage; and a third transistor which is a MOSFET with the first polarity and has a gate to which an input signal is configured to be inputted. The output current from the third current source is configured to flow as a drain current through the third transistor. The amplification stage includes a fourth transistor which is a MOSFET with the second polarity and has a gate to which an output of the source follower stage is configured to be inputted. The amplification stage is configured to amplify the output of the source follower stage.

Advantageous Effect of Invention

According to a bias circuit of the present invention, since a bias voltage on which characteristics of a MOSFET with a first polarity and a MOSFET with a second polarity are reflected is outputted, it is possible to supply the bias voltage suppressing influence of process variation, to an amplification circuit.

According to an amplification apparatus of the present invention, since the bias voltage on which the characteristics of the MOSFET with the first polarity and the MOSFET with the second polarity are reflected is supplied from the bias circuit, it is possible to suppress the influence of the process variation on an amplified output.

DESCRIPTION OF EMBODIMENTS

First Embodiment

Figure 1:
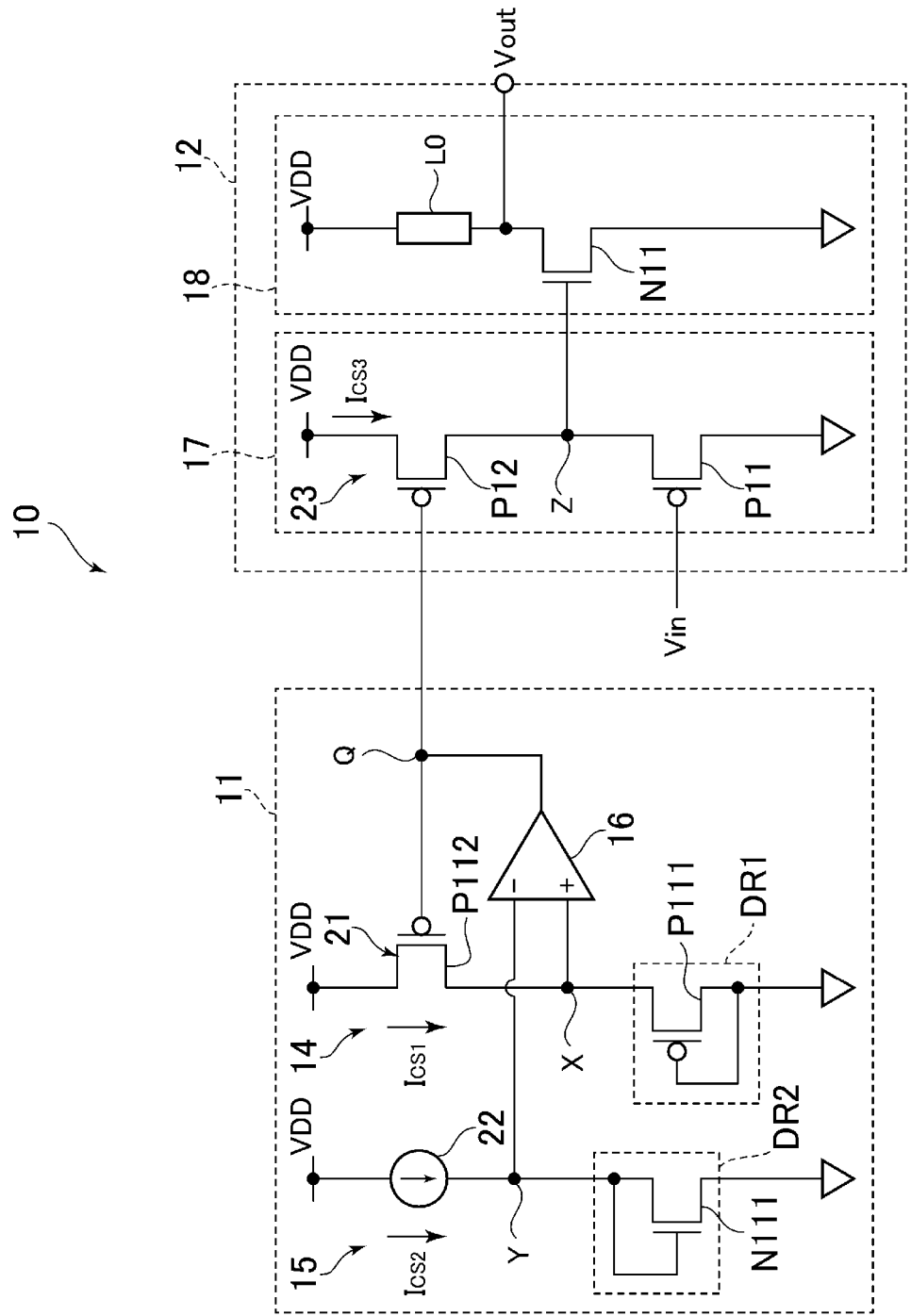
FIG. 1 is a circuit diagram illustrating a circuit configuration of an amplification apparatus of a first embodiment of the present invention.

In FIG. 1, an amplification apparatus 10 according to the embodiment includes a bias circuit 11 and an amplification circuit 12. The bias circuit 11 includes a first voltage outputting unit 14, a second voltage outputting unit 15 and a voltage comparator 16. The amplification circuit 12 includes a source follower stage 17 and an amplification stage 18 and constitutes an inverting amplifier in this embodiment. In this embodiment, a p-type metal-oxide-semiconductor field-effect transistor (MOSFET) is used as a first-polarity MOSFET, and an n-type MOSFET is used as a second-polarity MOSFET.

The first voltage outputting unit 14 includes a first current source 21 and a first voltage dropping portion DR1 connected in series between a power supply terminal of a power source voltage VDD and the ground, and the first voltage dropping portion DR1 includes a transistor P111 which is a p-type MOSFET (hereinafter referred to as a p-MOSFET). The first current source 21 includes a p-MOSFET transistor P112, and its source is connected to the power supply terminal and drain is connected to a source of the transistor P111, respectively. A gate of the transistor P112 is connected to an output terminal 16a (see FIG. 2) of the voltage comparator 16, and a bias voltage Vq outputted from the voltage comparator 16 is applied as a gate voltage.

When the bias voltage Vq is applied as a gate voltage, the transistor P112 causes a current $I_{CS1}$ according to the bias voltage Vq to flow through the transistor P111. A drain of the transistor P111 as a first transistor is grounded. The transistor P111 is diode-connected, that is, the gate of the transistor P111 is connected to the drain of the transistor P111.

The first voltage outputting unit 14 configured as described above outputs a voltage $V_X$ of a connection point between the first current source 21 and the first voltage dropping portion DR1, that is, a connection point X between the drain of the transistor P112, which is an output terminal of the first current source 21, and the source of the transistor P111 as a first output voltage.

The second voltage outputting unit 15 includes a second current source 22 and a second voltage dropping portion DR2 connected in series between the power supply terminal and the ground, and the second voltage dropping portion DR2 includes a transistor N111 which is an n-type MOSFET (hereinafter referred to as an n-MOSFET). The second current source 22 is a constant current source which causes a constant current $I_{CS2}$ to flow and is connected between the power supply terminal and the transistor N111. A drain of the transistor N111 as a second transistor is connected to an output terminal of the second current source 22, and a source is grounded. This transistor N111 is diode-connected, that is, the gate of the transistor N111 is connected to the drain of the transistor N111. The second voltage outputting unit 15 configured as described above outputs a voltage $V_Y$ of a connection point between the second current source 22 and the second voltage dropping portion DR2, that is, a connection point Y between the output terminal of the second current source 22 and the drain of the transistor N111 as a second output voltage.

The above transistor P111 reflects characteristic fluctuations of the transistor P111 itself according to a current from the first current source 21 to increase and decrease its drain voltage (a drain-source voltage). The voltage $V_X$ of the connection point X is equal to the drain voltage of the transistor P111. Therefore, from the first voltage outputting unit 14, a voltage drop according to characteristics of the transistor P111, which is a p-MOSFET, is outputted as the voltage $V_X$ as a first output voltage. The transistor N111 reflects characteristic fluctuations of the transistor N111 itself according to a current from the second current source 22 to increase and decrease its drain voltage. The voltage $V_Y$ of the connection point Y is equal to the drain voltage of the transistor N111. Therefore, from the second voltage outputting unit 15, a voltage drop according to characteristics of the transistor N111, which is an n-MOSFET, is outputted as the voltage $V_Y$ as a second output voltage.

According to the characteristics of the transistors P111 and N111 that are provided independently, the first voltage dropping portion DR1 and the second voltage dropping portion DR2 generate the voltage $V_X$ and the voltage $V_Y$ on both ends of the transistors P111 and N111, respectively. That is, a voltage drop of the transistor P111 reflects the characteristic fluctuations of the transistor P111 relative to a value of a drain current (=the current $I_{CS1}$) that flows through the transistor P111, and a voltage drop of the transistor N111 reflects the characteristic fluctuations of the transistor N111 relative to a value of a drain current (=the current $I_{CS2}$) that flows through the transistor N111.

In this example, the first output voltage (the voltage $V_X$) is the voltage drop of the transistor P111 itself on which the characteristic fluctuations of the transistor P111 are reflected, and the second output voltage (the voltage $V_Y$) is the voltage drop of the transistor N111 itself on which the characteristic fluctuations of the transistor N111 are reflected. The first and second output voltages only have to include voltage drop components of the corresponding transistors P111 and N111, respectively, and increase and decrease according to the characteristics of the transistors. Therefore, for example, by employing a configuration in which a resistance element is connected in series to the transistor P111, the first output voltage can be obtained by adding a voltage drop of the resistance element to the voltage drop of the transistor P111 as described later.

In the voltage comparator 16, a non-inverting input (+) terminal 16p (see FIG. 2) is connected to the connection point X of the first voltage outputting unit 14 and an inverting input (−) terminal 16n (see FIG. 2) is connected to the connection point Y of the second voltage outputting unit 15, respectively. The voltage comparator 16 connected as described above outputs, from the output terminal 16a, an output voltage as the bias voltage Vq. The output voltage is increased and decreased based on a difference between the voltage $V_X$ inputted to the non-inverting input terminal 16p and the voltage $V_Y$ inputted to the inverting input terminal 16n. That is, the voltage comparator 16 outputs a reference bias voltage Vq determined in advance when there is no difference between the voltage $V_X$ and the voltage $V_Y$, causes the bias voltage Vq to be higher than the reference bias voltage when the voltage $V_X$ is higher than the voltage $V_Y$, and, on the contrary, causes the bias voltage Vq to be lower than the reference bias voltage when the voltage $V_X$ is lower than the voltage $V_Y$. The larger the difference between the voltage $V_X$ and the voltage $V_Y$ is, the larger a difference (an absolute value) of the outputted bias voltage Vq from the reference bias voltage Vq is.

The output terminal 16a of the voltage comparator 16 is connected to the gate of the transistor P112 and to the amplification circuit 12 as described above. Thereby, the bias voltage Vq from the voltage comparator 16 is applied as the gate voltage of the transistor P112 and supplied to the amplification circuit 12.

Figure 2:
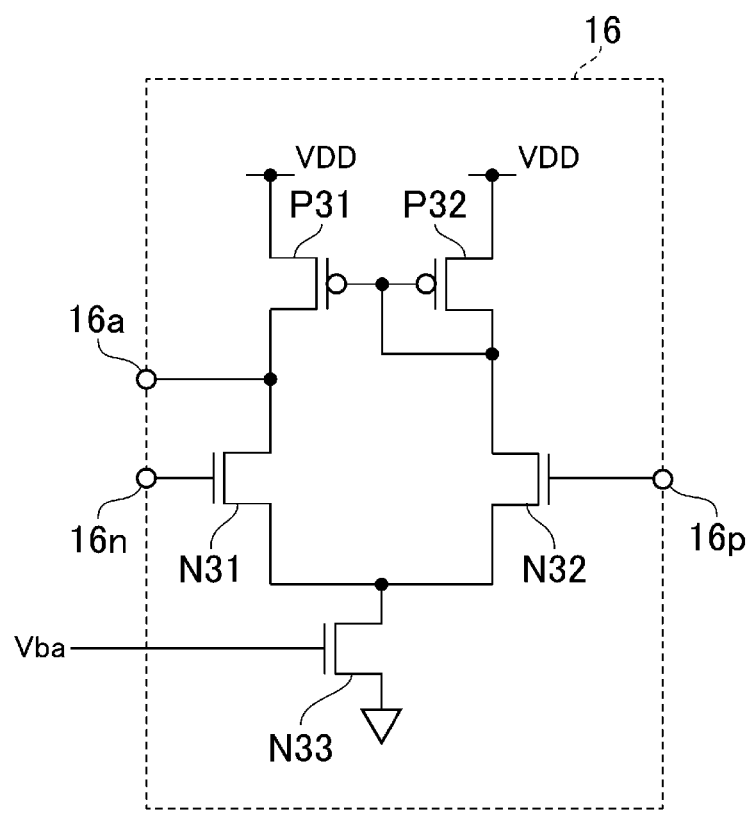
FIG. 2 is a circuit diagram illustrating an example of a circuit configuration of a voltage comparator.

As exemplified in FIG. 2, the voltage comparator 16 includes a pair of transistors P31 and P32 constituting a current mirror circuit, a differential pair of transistors N31 and N32 and a transistor N33 as a tail current source. The transistors P31 and P32 are p-MOSFETs, and the transistors N31, N32 and N33 are n-MOSFETs. Sources of the transistors P31 and P32 are connected to the power supply terminal, and gates of the transistors P31 and P32 are connected to each other. The gate of the transistor P32 is connected to the drain of the transistor P32, that is, the transistor P32 is diode-connected. A drain of the transistor P31 is connected to a drain of the transistor N31, and the drain of the transistor P32 is connected to a drain of the transistor N32. Sources of the transistors N31, N32 are connected to a drain of the transistor N33, and a source of the transistor N33 is grounded.

A gate of the transistor N31 is connected to the inverting input terminal 16n, and the voltage $V_Y$ is applied. A gate of the transistor N32 is connected to the non-inverting input terminal 16p, and the voltage $V_X$ is applied. A connection point between the drain of the transistor P31 and the drain of the transistor N31 is the output terminal 16a of the voltage comparator 16, and outputs the bias voltage Vq. To a gate of the transistor N33, a bias voltage Vba is applied so that the transistor N33 operates in a saturation region. Thereby, the transistor N33 works as a tail current source.

In FIG. 1, the amplification circuit 12 inverts and amplifies an amplitude of a voltage (hereinafter referred to as an input signal voltage) Vin of an input signal which is, for example, a small amplitude signal and outputs the voltage as an output voltage Vout. The source follower stage 17 of this amplification circuit 12 shifts a level of the input signal voltage Vin, which is a small amplitude signal, and includes a third current source 23 and a transistor P11 connected in series between the power supply terminal and the ground. The third current source 23 includes a p-MOSFET transistor P12 of the same type as the first current source 21, and its source is connected to the power supply terminal and the drain is connected to a source of the transistor P11, respectively. A gate of the transistor P12 is connected to a connection point Q between the gate of the transistor P112 of the first voltage outputting unit 14 and the output terminal of the voltage comparator 16. Thereby, the transistor P12 causes a current $I_{CS3}$ according to the bias voltage Vq to flow. This current $I_{CS3}$ increases and decreases together with the current $I_{CS1}$ of the first current source 21. A drain of the transistor P11 is grounded, and the input signal voltage Vin is applied to its gate. The source follower stage 17 connected as described above changes a voltage $V_Z$ of a connection point Z between the drain of the transistor P12 and the source of the transistor P11 depending on the input signal voltage Vin.

The amplification stage 18 includes a load L0 and a transistor N11, which is an n-MOSFET, connected in series between the power supply terminal and the ground. One terminal of the load L0 is connected to the power supply terminal, and the other terminal is connected to a drain of the transistor N11. A source of the transistor N11 is grounded, and the connection point Z is connected to its gate. A voltage of a connection point between the other terminal of the load L0 and the drain of the transistor N11 is outputted as the output voltage Vout. The amplification stage 18 connected as described above forms a source-grounded circuit, and inverts and amplifies the voltage $V_Z$ of the connection point Z to output the output voltage Vout.

Though in the above example, a small amplitude signal is given to the amplification circuit 12, application to such a configuration that the input signal voltage Vin inputted to the amplification circuit 12 is a DC potential, and the amplification circuit 12 works as a DC voltage amplification circuit, for example, to a voltage regulator to be described later as a third embodiment and the like is also possible.

Instead of planar MOSFETs, vertical body channel (BC)-MOSFETs can be used as the transistors for the amplification apparatus 10 to improve circuit characteristics as described later. As exemplified in FIG. 3, a vertical BC-MOSFET 30 has a semiconductor pillar 31, a gate electrode 32 provided in a manner of surrounding a central part of the semiconductor pillar 31, and a gate oxide film provided between the gate electrode 32 and the semiconductor pillar 31. On the semiconductor pillar 31, a semiconductor region 34 as a channel, a drain region 35 and a source region 36 are provided on a central part, one end and the other end, respectively. The vertical BC-MOSFET 30 is formed, for example, on a silicon substrate 38. If the vertical BC-MOSFET 30 is an n-MOSFET, the semiconductor pillar 31 is a p-type semiconductor (for example, silicon), and end portions of the semiconductor pillar 31 are doped so that both of the drain region 35 and the source region 36 are to be of the n-type. If the vertical BC-MOSFET 30 is a p-MOSFET, the semiconductor pillar 31 is an n-type semiconductor, and the end portions of the semiconductor pillar 31 are doped so that both of the drain region 35 and the source region 36 are to be of the p-type.

In the vertical BC-MOSFET 30, a gate width W corresponds to an outer perimeter length of the semiconductor pillar 31, and is expressed as $\pi\phi$ when a diameter of the semiconductor pillar 31 is denoted by $\phi$. A gate length L corresponds to a height of the gate electrode 32 (a length in an axial direction of the semiconductor pillar 31). In design of a vertical BC-MOSFET circuit, a plurality of vertical BC-MOSFETs are connected in parallel to realize a desired gate width.

A vertical BC-MOSFET has a function of suppressing a short channel effect. Therefore, when the gate length L is short, a reciprocal of drain-source conductance of the vertical BC-MOSFET ($1/g_{ds}$), that is, an output impedance $r_{out}$ is higher in comparison with that of a planar MOSFET with the same gate length L. As a result, when vertical BC-MOSFETs are used, fluctuations of transistor currents (that is, fluctuations of currents of the first current source 21 and the third current source 23) caused by fluctuations of the power source voltage VDD are reduced in comparison with the case of planar MOSFETs. Details about this are described in Non Patent Literature 1. Thus, electric potentials of the connection points X, Y and Z are not easily susceptible to the fluctuations of the power source voltage VDD, and, therefore, the output voltage Vout of the amplification apparatus 10 is also not easily susceptible to the fluctuations of the power source voltage VDD.

Furthermore, though a gain decreases at a high temperature in a common amplification circuit, it is possible to increase the gain at all temperatures when vertical BC-MOSFETs are adopted, and, therefore, a stable operation becomes possible up to a higher temperature. Further, as for planar MOSFETs, the short channel effect becomes obvious by miniaturization of the structure, and the output impedance $r_{out}$ tends to be small. As for vertical BC-MOSFETs, however, a high output impedance can be obtained even by miniaturization, and a high gain can be maintained, for example, in the amplification stage 18. In a power source apparatus to be described later, it is also possible to cause gains of the voltage comparator 16 and the amplification stage 18 to be higher than predetermined gain and obtain superior characteristics. For example, a gain G in the amplification stage 18 can be determined by Formula (A) below when a trans-conductance of the transistor N11, an output impedance and a resistance value of the load L0 are denoted by $g_m$, $r_{out}(=1/g_{ds})$ and $R_{L0}$, respectively.

[Math. 1]

$$G = g_m \cdot \frac{R_{L0}}{\left(1 + \frac{R_{L0}}{r_{out}}\right)} \qquad (A)$$

As can be seen from Formula (A) above, it becomes possible to increase the gain G by using vertical BC-MOSFETs with a high output impedance $r_{out}$.

Figure 4:
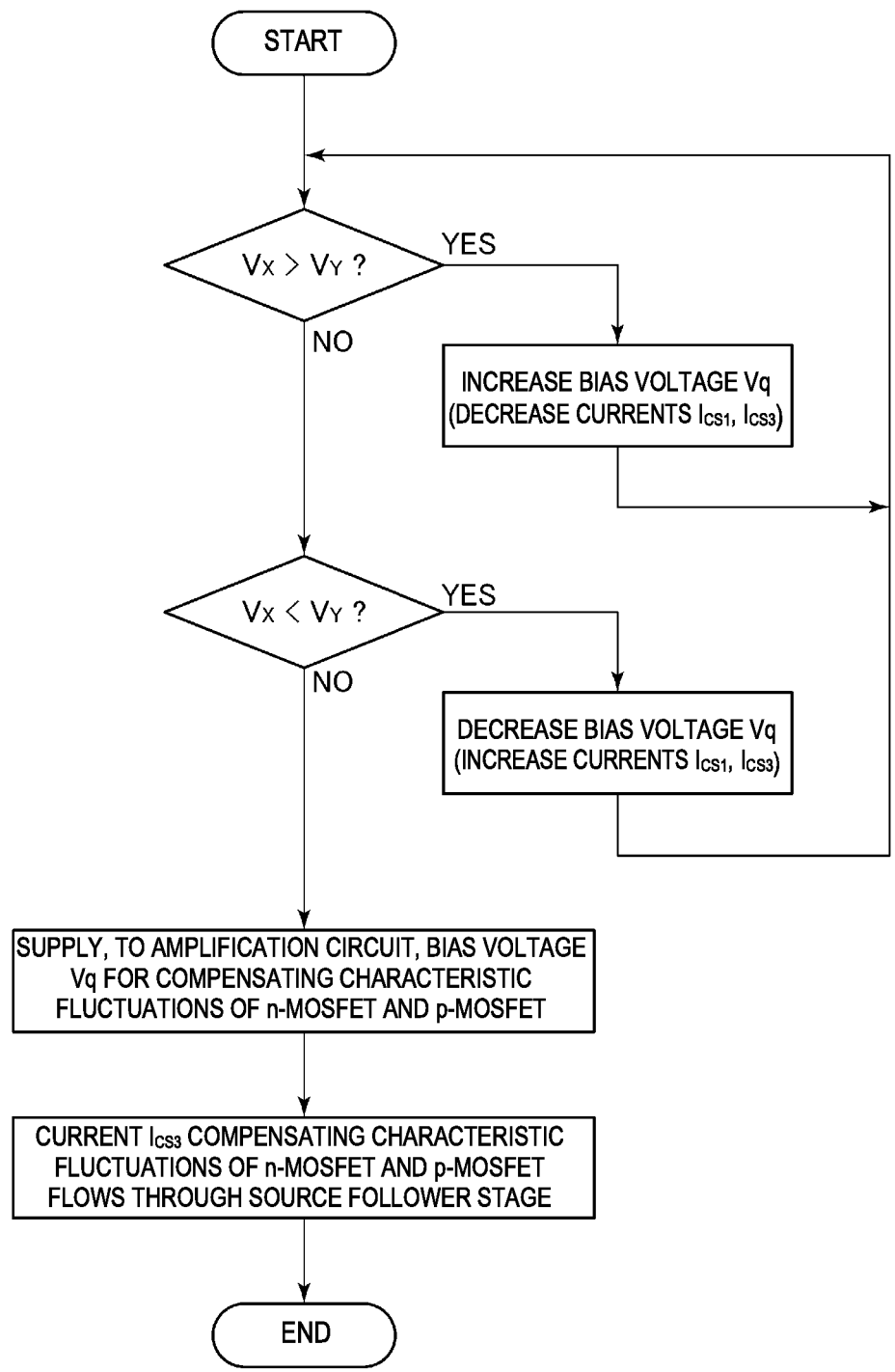
FIG. 4 is a flowchart for adjusting a bias voltage being.

Next, a description will be made on an outline of an operation of the amplification apparatus 10 configured as described above. Each of the transistors of the amplification apparatus 10 works in the saturation region. As a procedure for the bias voltage Vq and the current $I_{CS3}$ being adjusted is shown in FIG. 4, the voltage $V_X$ from the first voltage outputting unit 14 including the transistor P111 and the voltage $V_Y$ from the second voltage outputting unit 15 including the transistor N111 are inputted to the voltage comparator 16 in the bias circuit 11. Then, the voltage $V_X$ and the voltage $V_Y$ are compared by the voltage comparator 16, and the bias voltage Vq is increased and decreased depending on the result of the comparison.

For example, when the voltage $V_X$ is higher than the voltage $V_Y$, the voltage comparator 16 increases its output, that is, the bias voltage Vq according to a difference between the voltage $V_X$ and the voltage $V_Y$. The bias voltage Vq is applied as a gate voltage to the transistor P112, which is a p-MOSFET. Therefore, by the bias voltage Vq being increased, the transistor P112 decreases a drain current of the transistor P112, that is, the current $I_{CS1}$ by an amount corresponding to the increase in the bias voltage Vq. Since this current $I_{CS1}$ flows as a drain current of the transistor P111, the drain voltage of the transistor P111 decreases due to the decrease in the current $I_{CS1}$. Since the drain voltage of the transistor P111 and the voltage $V_X$ of the connection point X are the same, the voltage $V_X$ consequently decreases.

On the other hand, when the voltage $V_X$ is lower than the voltage $V_Y$, the voltage comparator 16 decreases the bias voltage Vq according to a difference between the voltage $V_X$ and the voltage $V_Y$. Thereby, the gate voltage of the transistor P112 decreases, and the current $I_{CS1}$ increases. Due to the increase in the current $I_{CS1}$, the drain voltage of the transistor P111, that is, the voltage $V_X$ of the connection point X increases.

In this way, the bias voltage Vq is increased and decreased according to the voltage $V_X$ and the voltage $V_Y$, and the current $I_{CS1}$ is increased and decreased by the increase and decrease in the bias voltage Vq to adjust the bias voltage Vq so that the voltage $V_X$ becomes equal to the voltage $V_Y$.

The bias voltage Vq adjusted as described above is supplied to the amplification circuit 12 and applied as a gate voltage of the transistor P12 of the source follower stage 17. Therefore, the transistor P12 outputs the current $I_{CS3}$ depending on the bias voltage Vq, and this flows as a drain current of the transistor P11. Then, the transistor P11 changes a drain voltage, that is, the voltage $V_Z$ of the connection point Z depending on change in the input signal voltage Vin applied as a gate voltage. At this time, the voltage $V_Z$ depends on the current $I_{CS3}$.

The voltage $V_Z$ of the connection point Z is applied as a gate voltage of the transistor N11 of the amplification stage 18. Thereby, the voltage $V_Z$ of the connection point Z is amplified by the amplification stage 18. Consequently, the input signal voltage Vin is inverted and amplified, and is outputted as the output voltage Vout from the amplification apparatus 10.

Here, a drain current Ids of a transistor, which is a MOSFET, is given by Formula (B). A value W, a value L and a value Cox indicate a gate width, a gate length and a gate oxide film capacity per unit area of the MOSFET, respectively, and a value μ indicates an electron mobility. A value Vgs indicates a gate voltage, and a value Vth indicates a threshold voltage. A description will be made below, referring to a coefficient K including the gate width, the gate length, the gate oxide film capacity per unit area and the electron mobility as shown in Formula (B) as a gain coefficient for convenience.

[Math. 2]

$$Ids = K(Vgs - Vth)^2 \qquad (B)$$
$$\text{where, } K = \frac{1}{2}\frac{W}{L}\mu\,Cox$$

In the case of diode-connecting MOSFETs like the transistors P111, N111, the gate voltage Vgs and the drain voltage Vds are equal to each other, and, from Formula (B) above, the gate voltage Vgs and the drain voltage Vds when the drain current Ids is flowing can be given by Formula (C) below:

[Math. 3]

$$Vgs = Vds = Vth + \sqrt{\frac{Ids}{K}} \qquad (C)$$

In the first voltage outputting unit 14, the current $I_{CS1}$ from the first current source 21 is supplied to the first voltage dropping portion DR1. In the first voltage dropping portion DR1, the current $I_{CS1}$ flows as the drain current Ids of the transistor P111 and generates the drain voltage Vds. The drain voltage Vds of the transistor P111 becomes the voltage $V_X$ of the connection point X. The voltage $V_X$ is a value determined according to the characteristics of the transistor P111, which is a p-MOSFET, including a threshold voltage under the current $I_{CS1}$ by Formula (C). That is, the voltage $V_X$ having a positive correlation with the threshold voltage of the transistor P111 is obtained by the first voltage dropping portion DR1.

In the second voltage outputting unit 15, the current $I_{CS2}$ from the second current source 22 is supplied to the second voltage dropping portion DR2. In the second voltage dropping portion DR2, the current $I_{CS2}$ flows as the drain current Ids of the transistor N111 and generates the drain voltage Vds of the transistor N111. The drain voltage Vds of the transistor N111 becomes the voltage $V_Y$ of the connection point Y. The voltage $V_Y$ is a value determined according to the characteristics of the transistor N111, which is an n-MOSFET, including a threshold voltage under the constant current $I_{CS2}$ by Formula (C). That is, the voltage $V_Y$ having a positive correlation with the threshold voltage of the transistor N111 is obtained by the second voltage dropping portion DR2. Then, the bias voltage Vq is increased and decreased such that the voltage $V_X$ becomes equal to the voltage $V_Y$.

A value of the bias voltage Vq increased and decreased as described above reflects the characteristic fluctuations of the n-MOSFET and the p-MOSFET due to process variation and the like, and compensates the characteristic fluctuations of the n-MOSFET and the p-MOSFET as described later in details. Then, the transistor P12 causes the current $I_{CS3}$ which is a drain current according to the bias voltage Vq to flow through the source follower stage 17. That is, the current $I_{CS3}$ adjusted to compensate each of the characteristic fluctuations of both of the n-MOSFET and the p-MOSFET flows through the source follower stage 17.

Thereby, even if there are characteristic fluctuations of the p-MOSFET transistor P11 in the source follower stage 17 and the n-MOSFET transistor N11 in the amplification stage 18 due to process variation and the like, such a favorable output voltage Vout that characteristic change in the amplification circuit 12 is suppressed is obtained. For example, even when the characteristics of the p-MOSFET and the n-MOSFET fluctuate in an inverse correlation, such a favorable output voltage Vout that the characteristic change in the amplification circuit 12 is suppressed is obtained.

Details of a reason why influence of the characteristic fluctuations of the MOSFETs can be suppressed will be described with a case where the p-MOSFET is Slow and the n-MOSFET is Fast, respectively (hereinafter referred to as P/NMOS=S/F), among cases where current characteristics of the p-MOSFET and the n-MOSFET fluctuate in an inverse correlation, as an example. Here, Slow means such a characteristic that, based on a Typical (standard) MOSFET, an absolute value of the threshold voltage is large, and an absolute value of the drain current Ids when a predetermined gate voltage is applied is small. Fast means such a characteristic that an absolute value of the threshold voltage is small, and an absolute value of the drain current Ids when the predetermined gate voltage is applied is large. In this case, each transistor operates in a saturation region.

In the case of P/NMOS=S/F, for the p-MOSFET, a threshold voltage of Typical is denoted by $V_{tp0}$, a threshold voltage of Slow is denoted by $V_{tpSF}$, and a difference between the threshold voltage of Typical and the threshold voltage of Slow is denoted by $\Delta V_{tp}$, and, for the n-MOSFET, a threshold voltage of Typical is denoted by $V_{tn0}$, a threshold voltage of Fast is denoted by $V_{tnSF}$ and a difference between the threshold voltage of Typical and the threshold voltage of Fast is denoted by $\Delta V_{tn}$. Then, the relationships among these are given by Formulas (1) and (2) below. The threshold voltage of the n-MOSFET is positive, and the threshold voltage decreases in the case of Fast and increases in the case of Slow. The threshold voltage of the p-MOSFET is negative, and the threshold voltage increases in the case of Fast and decreases in the case of Slow.

[Math. 4]

$$|V_{tpsF}|=|V_{tp0}|+|\Delta V_{tp}| \quad (1)$$

$$|V_{tnsF}|=|V_{tn0}|-|\Delta V_{tn}| \quad (2)$$

In order to, relative to a case where the p-MOSFET and the n-MOSFET are Typical (hereinafter referred to as P/NMOS=T/T), obtain the same output voltage Vout from the same input signal voltage Vin in the case of P/NMOS=S/F, it is necessary that a current that flows through the load L0 of the amplification stage 18 in the case of P/NMOS=S/F is equal to a current that flows through the load L0 in the case of P/NMOS=T/T. Since the current that flows through the load L0 is a drain current that flows through the transistor N11, the current depends on the gate voltage of the transistor N11, that is, the voltage $V_Z$ of the connection point Z.

Here, for the sake of simplicity, an assumption is made that the characteristic fluctuations of each the transistors are exclusively fluctuations of the threshold voltage, and there are not fluctuations of the gain coefficient K almost at all. This assumption is appropriate for today's integrate circuits in which the power source voltage VDD becomes lower with advancement of miniaturization and which are more and more influenced by the threshold voltage. Under such an assumption, when $V_Z$ for obtaining the same output voltage Vout as P/NMOS=T/T even in the case of P/NMOS=S/F is denoted by $V_{ZSF.ideal}$, and the voltage $V_Z$ in the case of P/NMOS=T/T is denoted by $V_{Z0}$, $V_{ZSF.ideal}$ can be approximated by Formula (3) below.

[Math. 5]

$$V_{ZSF.ideal} \approx V_{Z0} - |\Delta V_{tn}| \quad (3)$$

Formula (3) suggests that, in order for the output voltage Vout from the amplification apparatus 10 not to be influenced by process variation, the voltage $V_Z$ of the connection point Z is required to change in correlation with a fluctuation amount $|\Delta V_{tn}|$ of the threshold voltage of the n-MOSFET, as well as be less influenced by fluctuations of the threshold voltage of the p-MOSFET. That is, it is necessary not only to compensate the characteristics of the p-MOSFET but also to compensate the characteristics of the n-MOSFET. In the case of P/NMOS=S/F, it is necessary to cause the voltage $V_Z$ to be lower than the case of P/NMOS=T/T.

When a current flowing through the transistor P11 is denoted by $I_{CS30}$ in the case of P/NMOS=T/T, the current $I_{CS30}$ is given by Formula (4) below using a gain coefficient $K_{P11}$ and input signal voltage Vin of the transistor P11, from the relationship of Formula (B). Formula (4) can be transformed like Formula (5).

[Math. 6]

$$I_{CS30} = K_{p11}(V_{Z0} - Vin - |V_{tp0}|)^2 \quad (4)$$

$$\sqrt{\frac{I_{CS30}}{K_{p11}}} = V_{Z0} - Vin - |V_{tp0}|^2 \quad (5)$$

Figure 20:
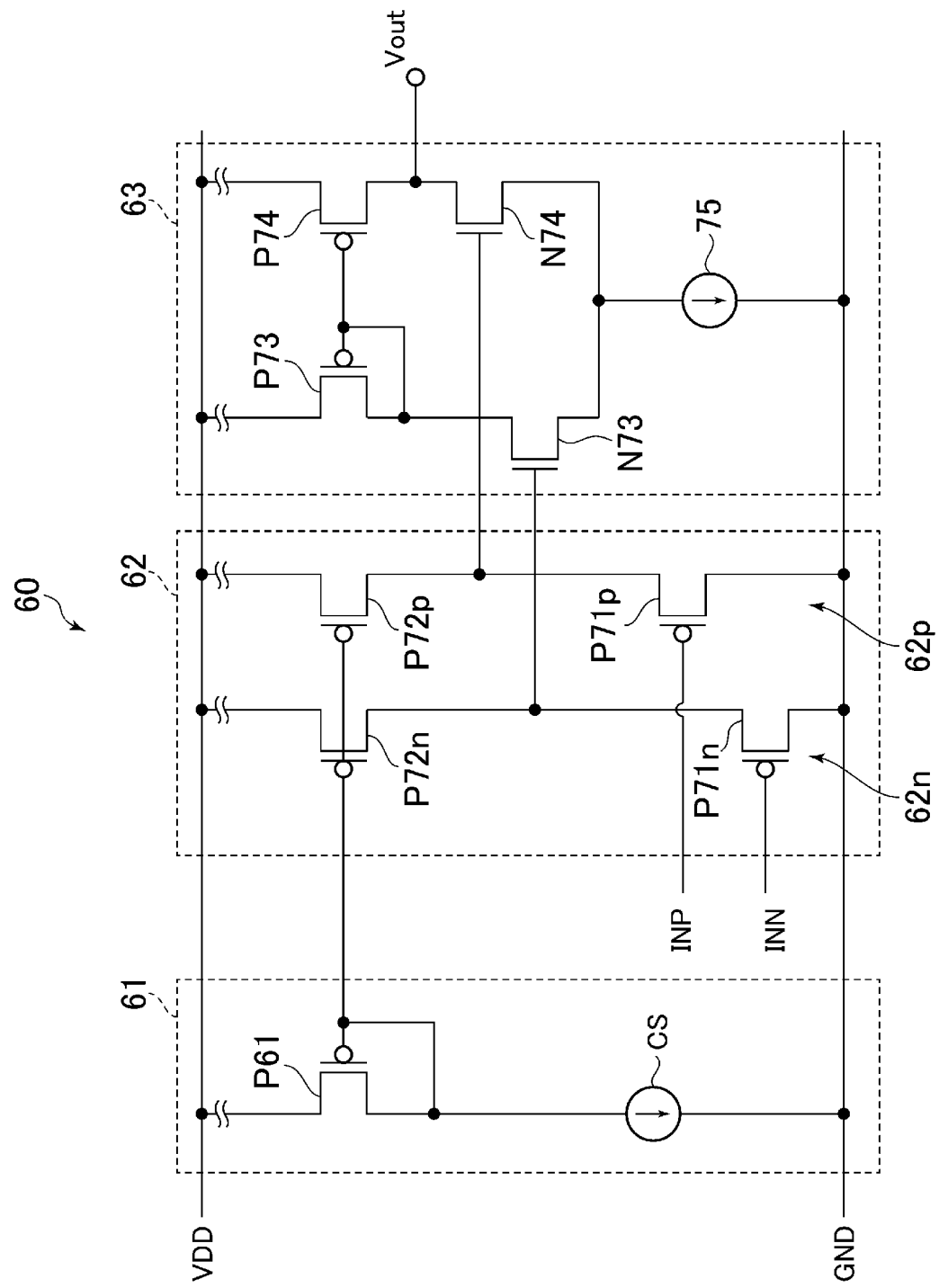
FIG. 20 is a circuit diagram illustrating a conventional amplification apparatus.
Figure 21:
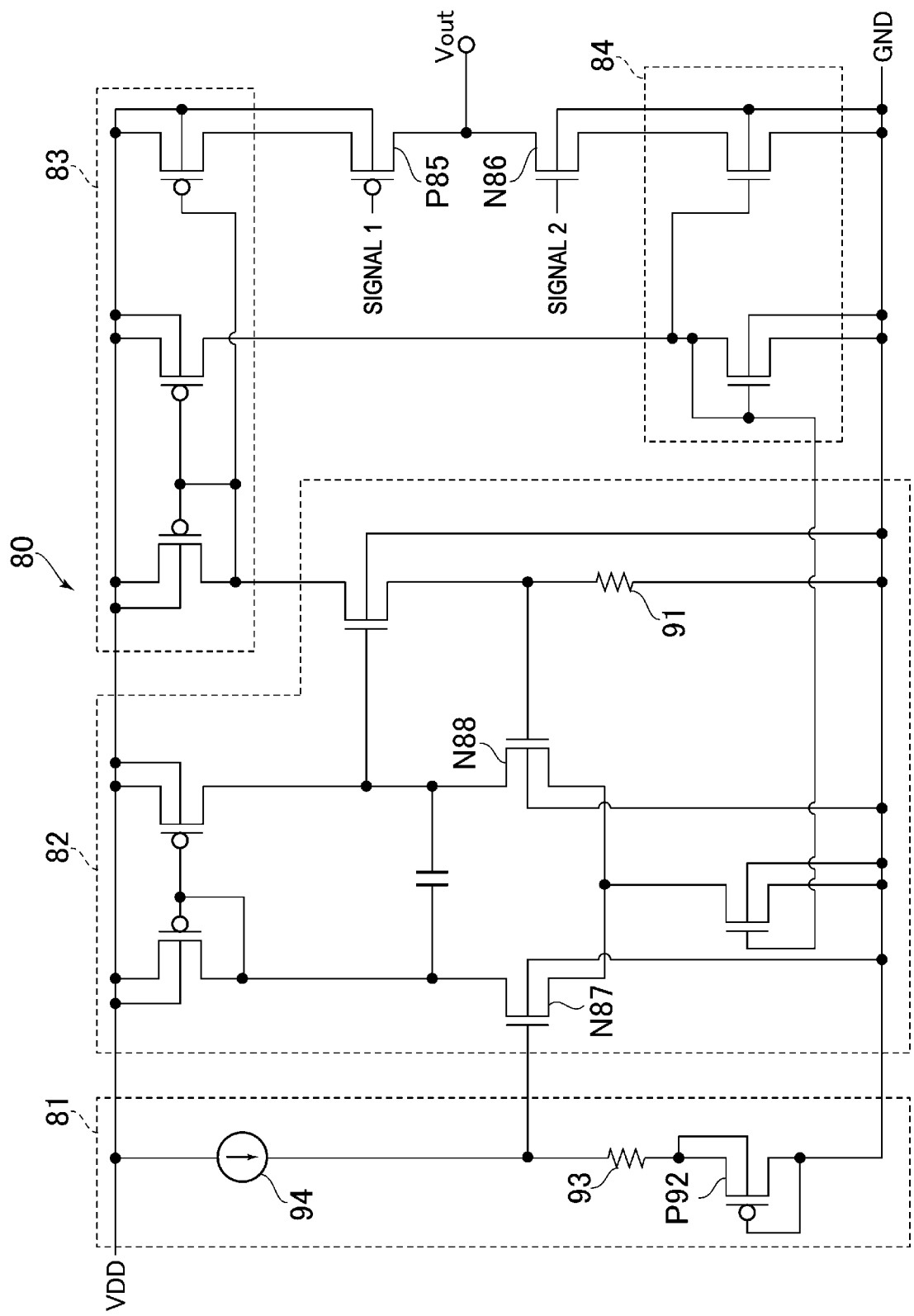
FIG. 21 is a circuit diagram illustrating a conventional charge pump circuit.

Here, a description will be made on what problem occurs if the conventional bias circuit 61 as shown in FIG. 20 in which the constant current source CS and the p-MOSFET transistor P61 are connected in series is used instead of the bias circuit 11. In this case, the same gate voltage as the gate voltage of the transistor P61 is applied to the transistor P12 of the amplification circuit 12. Thus, in the case where the conventional bias circuit 61 is used, the current $I_{CS30}$ determined by the bias circuit 61 of the transistor P11 flows through the transistor P11, but the current $I_{CS30}$ does not directly correlate with characteristic fluctuations of the p-MOSFET and the n-MOSFET. That is, in the case of P/NMOS=S/F also, the same current $I_{CS30}$ as the case of P/NMOS=T/T flows through the transistor P11, and, therefore, a relationship shown by Formula (6) is obtained by Formulas (2) and (5). Values $V_{ZSF}$ and $K_{p11SF}$ in Formula (6) indicate a voltage of the connection point Z in the case of P/NMOS=S/F and a gain coefficient of the transistor P11 in the case of P/NMOS=S/F, respectively.

[Math. 7]

$$\sqrt{\frac{I_{CS30}}{K_{p11SF}}} = V_{ZSF} - Vin - |V_{tpSF}| = V_{ZSF} - Vin - (|V_{tp0}| + |\Delta V_{tp}|) \quad (6)$$

A relationship shown by Formula (7) is obtained by Formulas (5) and (6) above.

[Math. 8]

$$V_{ZSF} = V_{Z0} + |\Delta V_{tp}| + \left( \sqrt{\frac{I_{CS30}}{K_{p11SF}}} - \sqrt{\frac{I_{CS30}}{K_{p11}}} \right) \quad (7)$$

From the above assumption that the characteristic fluctuations of each transistor are exclusively fluctuations of the threshold voltage, and there are not fluctuations of the gain coefficient K almost at all, "$K_{p11SF} \approx K_{p11}$" is satisfied. However, in the case of P/NMOS=S/F, "$K_{p11SF} < K_{p11}$" tends to hold. Therefore, the voltage $V_{ZSF}$ in the case of P/NMOS=S/F is higher than the voltage $V_{Z0}$ in the case of P/NMOS=T/T by the fluctuation amount $|\Delta V_{tm}|$ of the threshold voltage of the p-MOSFET (the transistor P11) or more as shown by Formula (8). Then, Formula (9) is obtained by Formula (8) and Formula (3) described before.

[Math. 9]

$$V_{ZSF} \geq V_{Z0} + |\Delta V_{tp}| \quad (8)$$

$$V_{ZSF} - V_{ZSF.ideal} \geq |\Delta V_{tp}| + |\Delta V_{tm}| \quad (9)$$

In the conventional bias circuit, the voltage $V_{ZSF}$ of the connection point Z in the case of P/NMOS=S/F is higher than an ideal voltage $V_{ZSF.ideal}$ by more than a sum of a fluctuation amount $|\Delta V_{tp}|$ of the threshold voltage of the p-MOSFET in the case of being Slow and a fluctuation amount $|\Delta V_t|$ of the threshold voltage of the n-MOSFET in the case of being Fast as shown by Formula (9). As a result, a central value of the output voltage Vout of the amplification apparatus 10 becomes lower than a predetermined value in case of P/NMOS=T/T, which causes an output voltage error. Further, a state of the transistor N11 comes close to a linear region, and gain reduction occurs.

On the contrary, in a case where the p-MOSFET is Fast, and the n-MOSFET is Slow (referred to as P/NMOS=F/S), the voltage $V_Z$ of the connection point Z drops too low in the conventional bias circuit, so that a current of the transistor N11 becomes too low, and an operation speed slows down. Further, the central value of the output voltage Vout becomes higher than a predetermined value under P/NMOS=T/T, which causes an output voltage error.

In contrast, in the amplification apparatus 10 of the first embodiment according to the present invention, when a current that flows through the transistor P12 in the case of P/NMOS=T/T is denoted by $I_{p12}$ (=$I_{CS30}$), the voltage $V_{Z0}$ at the connection point Z is given by Formula (10) below. When a current that flows through the transistor P12 in the case of P/NMOS=S/F is denoted by $I_{p12SF}$, the voltage $V_{ZSF}$ at the connection point Z is given by Formula (11). Then, a relationship shown by Formula (12) below is obtained from Formulas (10) and (11).

[Math. 10]

$$\sqrt{\frac{I_{p12}}{K_{p11}}} = V_{Z0} - Vin - |V_{tp0}| \quad (10)$$

$$\sqrt{\frac{I_{p12SF}}{K_{p11SF}}} = V_{ZSF} - Vin - (|V_{tp0}| + |\Delta V_{tp}|) \quad (11)$$

$$\sqrt{\frac{I_{p12SF}}{K_{p11SF}}} - \sqrt{\frac{I_{p12}}{K_{p11}}} = V_{ZSF} - V_{Z0} - |\Delta V_{tp}| \quad (12)$$

Next, focusing on the bias circuit 11, when a current from the second current source 22 is denoted by $I_{CS2}$, a voltage of the connection point Y in the case of P/NMOS=T/T is denoted by $V_{Y0}$, and a gain coefficient of the transistor N111 is denoted by $K_{n111}$, Formula (13) holds. When a voltage of the connection point X in the case of P/NMOS=T/T is denoted by $V_{X0}$, a current flowing through the transistor P112 is denoted by $I_{p112}$, and a gain coefficient of the transistor P111 is denoted by $K_{p111}$, Formula (14) holds.

[Math. 11]

$$\sqrt{\frac{I_{CS2}}{K_{n111}}} = V_{Y0} - |V_{tn0}| \quad (13)$$

$$\sqrt{\frac{I_{p112}}{K_{p111}}} = V_{X0} - |V_{tp0}| \quad (14)$$

In the bias circuit 11, the voltage $V_X$ of the connection point X and the voltage $V_Y$ of the connection point Y are compared by the voltage comparator 16, and the bias voltage Vq, that is, $I_{p112}$ is increased and decreased depending on a difference between the voltages $V_X$ and $V_Y$ to satisfy "$V_{Y0}=V_{X0}$". Therefore, Formula (15) below is obtained by Formulas (13) and (14).

[Math. 12]

$$\sqrt{\frac{I_{p112}}{K_{p111}}} - \sqrt{\frac{I_{CS2}}{K_{n111}}} = -|V_{tp0}| + |V_{tn0}| \quad (15)$$

When the voltage of the connection point Y and the voltage of the connection point X in the case of P/NMOS=S/F are denoted by $V_{YSF}$ and $V_{XSF}$, respectively, Formulas (13) and (14) become Formulas (16) and (17), respectively. Here, $K_{n111SF}$ and $K_{p111SF}$ in Formulas (16) and (17) are the gain coefficients of the transistor N111 and the transistor P111 in the case of P/NMOS=S/F.

[Math. 13]

$$\sqrt{\frac{I_{CS2}}{K_{n111SF}}} = V_{YSF} - (|V_{tn0}| - |\Delta V_{tn}|) \quad (16)$$

-continued $$\sqrt{\frac{I_{p112SF}}{K_{p111SF}}} = V_{XSF} - (|V_{tp0}| + |\Delta V_{tp}|) \quad (17)$$

In the case of P/NMOS=S/F also, adjustment is performed by the voltage comparator 16 so that the voltage $V_{YSF}$ of the connection point Y and the voltage $V_{XSF}$ of the connection point X are equal to each other. Therefore, Formula (18) below is obtained by Formulas (16) and (17), and Formula (19) is obtained from Formulas (18) and (15).

[Math. 14]

$$\sqrt{\frac{I_{p112SF}}{K_{p111SF}}} - \sqrt{\frac{I_{CS2}}{K_{n111SF}}} = -(|V_{tp0}| + |\Delta V_{tp}|) + (|V_{tn0}| - |\Delta V_{tn}|) \quad (18)$$

$$\sqrt{\frac{I_{p112SF}}{K_{p111SF}}} - \sqrt{\frac{I_{p112}}{K_{p111}}} = \quad (19)$$

$$-(|\Delta V_{tp}| + |\Delta V_{tn}|) + \left(\sqrt{\frac{1}{K_{n111SF}}} - \sqrt{\frac{1}{K_{n111}}}\right)\sqrt{I_{CS2}}$$

By designing the current $I_{CS2}$ from the second current source 22 small, the second term on the right side of Formula (19) can be made sufficiently small. Further, "$K_{n111SF} \approx K_{n111}$" is also satisfied from the above assumption that the characteristic fluctuations of each of the transistors are exclusive fluctuations of the threshold voltage, and there are not fluctuations of the gain coefficient K almost at all, and the second term on the right side of Formula (19) can be said to be sufficiently small. As a result, Formula (20) is obtained from Formula (19).

[Math. 15]

$$\sqrt{\frac{I_{p112SF}}{K_{p111SF}}} - \sqrt{\frac{I_{p112}}{K_{p111}}} \approx -|\Delta V_{tp}| - |\Delta V_{tn}| \quad (20)$$

By appropriately specifying a width-to-length ratio (a ratio between gate width and gate length) of the gates of the transistors P11, P12, P111 and P112, which are p-MOSFETs, the following Formula (21) can be satisfied.

[Math. 16]

$$\sqrt{\frac{I_{p112}}{K_{p111}}} = \sqrt{\frac{I_{p12}}{K_{p11}}} \quad (21)$$

In this first embodiment, considering the source follower stage 17 or the like as a level shifter is provided to amplify the input signal voltage Vin that is close to the ground level, suppose that the input signal voltage Vin is low and close to the ground level. In this case, as shown by Formula (D) below, by causing a proportion of a width-to-length ratio (W/L)$_{p11}$ of the transistor P11 to a width-to-length ratio (W/L)$_{p111}$ of the transistor P111 to be equal to a ratio of a current I$_{p12}$ flowing through the transistor P12 to a current I$_{p112}$ flowing through the transistor P112, Formula (21) holds. Furthermore, such a relationship means that the proportion of the width-to-length ratio (W/L)$_{p11}$ of the transistor P11 to the width-to-length ratio (W/L)$_{p111}$ of the transistor P111 is equal to a proportion of a width-to-length ratio (W/L)$_{p12}$ of the transistor P12 to a width-to-length ratio (W/L)$_{p112}$ of the transistor P112. As described later, by satisfying Formula (21) (Formula (D)), it becomes possible to more favorably suppress the influence by process variation.

[Math. 17]

$$\frac{\left(\frac{W}{L}\right)_{p11}}{\left(\frac{W}{L}\right)_{p111}} = \frac{I_{p12}}{I_{p112}} = \frac{\left(\frac{W}{L}\right)_{p12}}{\left(\frac{W}{L}\right)_{p112}} \quad (D)$$

When Formula (21) holds, it is possible to perform approximation as shown by Formula (22) below using Formula (12), and Formula (23) is obtained from Formula (22) and Formula (20) above. Then, a relationship of Formula (24) is obtained from Formula (23).

[Math. 18]

$$\sqrt{\frac{I_{p112SF}}{K_{p111SF}}} - \sqrt{\frac{I_{p112}}{K_{p111}}} \approx \sqrt{\frac{I_{p12SF}}{K_{p11SF}}} - \sqrt{\frac{I_{p12}}{K_{p11}}} = \quad (22)$$

$$V_{ZSF} - V_{Z0} - |\Delta V_{tp}|$$

$$V_{ZSF} - V_{Z0} - |\Delta V_{tp}| \approx -|\Delta V_{tp}| - |\Delta V_{tn}| \quad (23)$$

$$V_{ZSF} \approx V_{Z0} - |\Delta V_{tn}| (\approx V_{ZSF \cdot ideal}) \quad (24)$$

By Formula (24) above, the voltage $V_{ZSF}$ of the connection point Z in the case of P/NMOS=S/F is almost equal to the ideal voltage $V_{ZSF.ideal}$ that causes the current flowing through the load L0 to be equal to a current flowing through the load L0 in the case of P/NMOS=T/T. Therefore, even in the case of P/NMOS=S/F, such a favorable output voltage Vout that characteristic change in the amplification circuit 12 is suppressed is obtained.

When P/NMOS=F/S holds, the voltage $V_{ZFS}$ of the connection point Z comes close to the ideal voltage by appropriately changing signs for addition and subtraction of the fluctuation amounts |V$_{tn}$|, |V$_{tp}$| of the threshold voltages in each of the above formulas, and it is shown that such a favorable output voltage Vout that characteristic fluctuations of the amplification circuit 12 are suppressed is obtained.

Even in a case where any one of the p-MOSFET and the n-MOSFET is Typical, and the other is Fast or Slow or in a case where both are Fast or Slow, the voltage V$_Z$ of the connection point Z comes close to the ideal voltage, and such a favorable output voltage Vout that the characteristic fluctuations of the amplification circuit 12 are suppressed is obtained.

Thus, the bias circuit 11 can give such a bias voltage Vq that appropriately correlates with the characteristic fluctuations of both of the p-MOSFET and the n-MOSFET to the amplification circuit 12, and the amplification circuit 12 performs a stable operation against process variation.

In the above description, the assumption is made that, in process variation, mainly the threshold voltage fluctuates, and the gain coefficients K of the transistors do not greatly fluctuate. However, the present invention is effective even when the gain coefficients K of the transistors fluctuate. This point is also apparent from simulations to be described later.

Furthermore, if a configuration in which a resistance element is not included inside the bias circuit 11 or the amplification circuit 12 is adopted like the amplification apparatus 10 of the present embodiment, the output voltage Vout is not influenced by fluctuations of a resistance element. By preventing the output voltage Vout from being influenced by fluctuations of a resistance element, it is possible to have more excellent resistance to fluctuations of the power source voltage VDD and perform more stable operation in comparison with a conventional amplification apparatus. The voltage comparator 16 compares the voltages $V_X$ and $V_Y$ by voltage drops of the p-MOSFET and the n-MOSFET having similar temperature dependence characteristics. Therefore, in comparison with a circuit that compares voltage drops of a MOSFET and a resistance element having different temperature characteristics, a stable operation is possible within a wide temperature range.

In the above example, the first and second voltage dropping portions DR1 and DR2 include one first transistor and one second transistor, respectively. However, a plurality of transistors may be connected in series for any one or both of the first and second voltage dropping portions DR1 and DR2.

Figure 5:
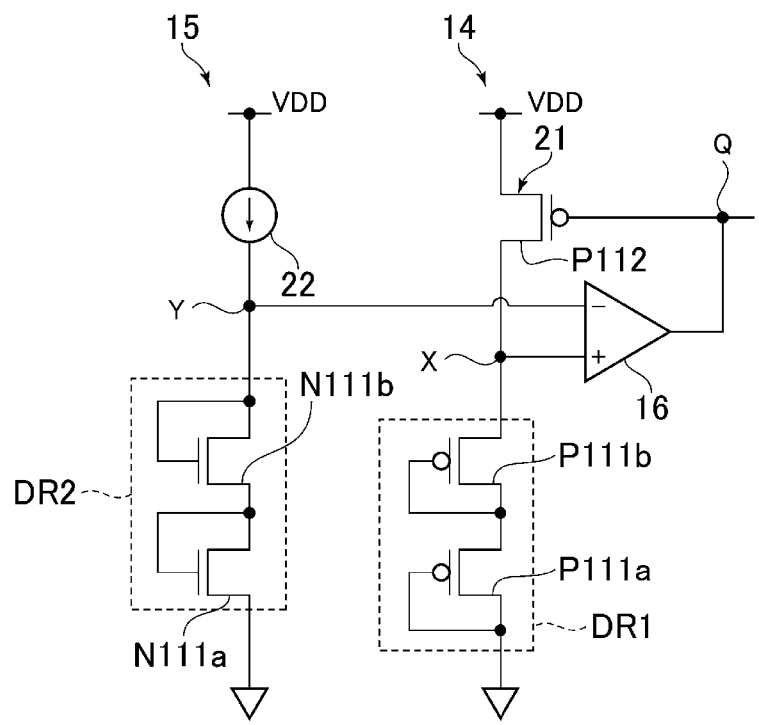
FIG. 5 is a circuit diagram illustrating an example in which each of first and second voltage dropping portions includes a plurality of transistors connected in series.

In an example shown in FIG. 5, transistors P111*a* and P111*b* as first transistors of the first voltage outputting unit 14 are provided, and the transistors P111*a* and P111*b* connected in series constitute the first voltage dropping portion DR1. Further, the second voltage outputting unit 15 is provided with transistors N111*a* and N111*b* as second transistors, and the transistors N111*a* and N111*b* connected in series constitute the second voltage dropping portion DR2. All of the transistors P111*a* and P111*b* and the transistors N111*a* and N111*b* are diode-connected. In an example shown in FIG. 6A, as the first voltage dropping portion DR1, the transistors P111*a*, P111*b* as the first transistors are provided and are connected in series the same as the example in FIG. 5, and, as for the second voltage dropping portion DR2, only the transistor N111 is provided as the second transistor. In an example shown in FIG. 6B, as for the first voltage dropping portion DR1, only the transistors P111 is provided as the first transistor, and, as for the second voltage dropping portion DR2, the transistors N111*a*, N111*b* as the second transistors are provided the same as the example in FIG. 5.

By connecting the plurality of first transistors and second transistors as described above, advantages described below are obtained. In the case where a plurality of first transistors and second transistors are connected as in the example in FIG. 5, the voltages $V_X$ and $V_Y$ of the connection points X and Y can be adjusted higher if necessary in comparison with those in the circuit configuration in FIG. 1. Therefore, there is an advantage that, when input at a high voltage is required to maximize input sensitivity of the voltage comparator 16, more favorable characteristics can be obtained. In the case where only either the first transistor or the second transistor is provided in plurality as in the examples in FIGS. 6A and 6B, a voltage on which characteristic fluctuations of a MOSFET with one polarity are more strongly reflected than characteristic fluctuations of a MOSFET with the other polarity is obtained at the connection point Q. Therefore, if the amplification circuit 12 is strongly influenced especially by the fluctuations of the MOSFET with the other polarity, the influence can be effectively suppressed.

Figure 6A:
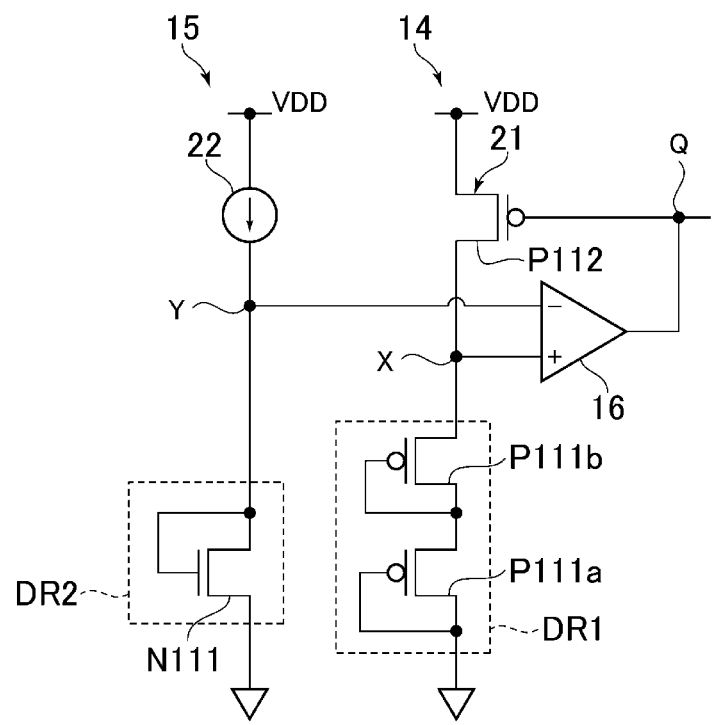
FIG. 6A is a circuit diagram illustrating an example in which only the first voltage dropping portion includes a plurality of transistors connected in series.
Figure 6B:
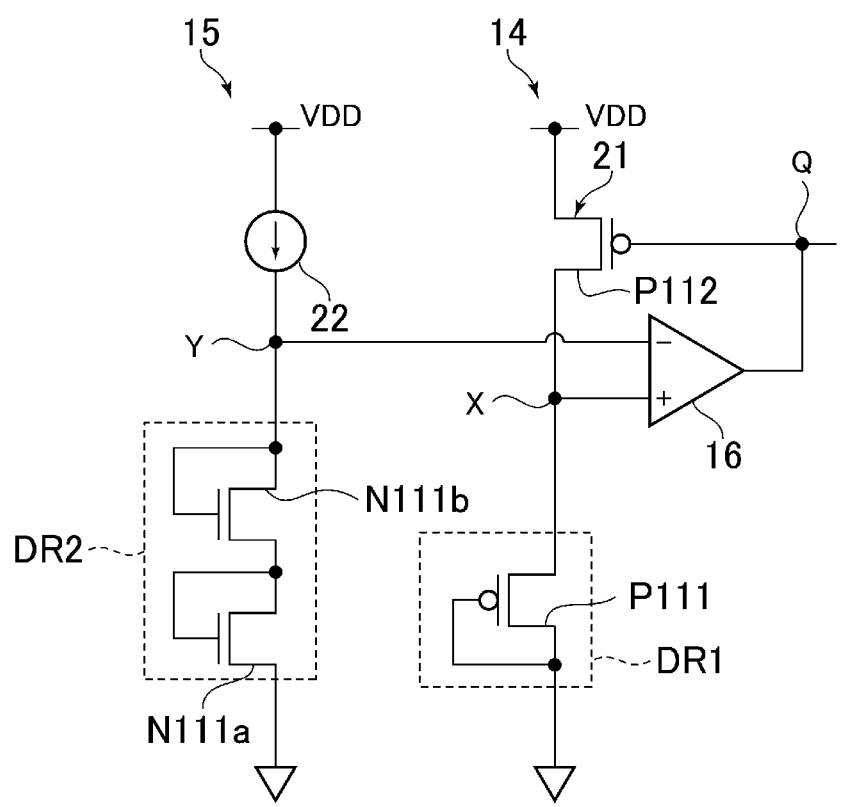
FIG. 6B is a circuit diagram illustrating an example in which only the second voltage dropping portion includes a plurality of transistors connected in series.
Figure 6C:
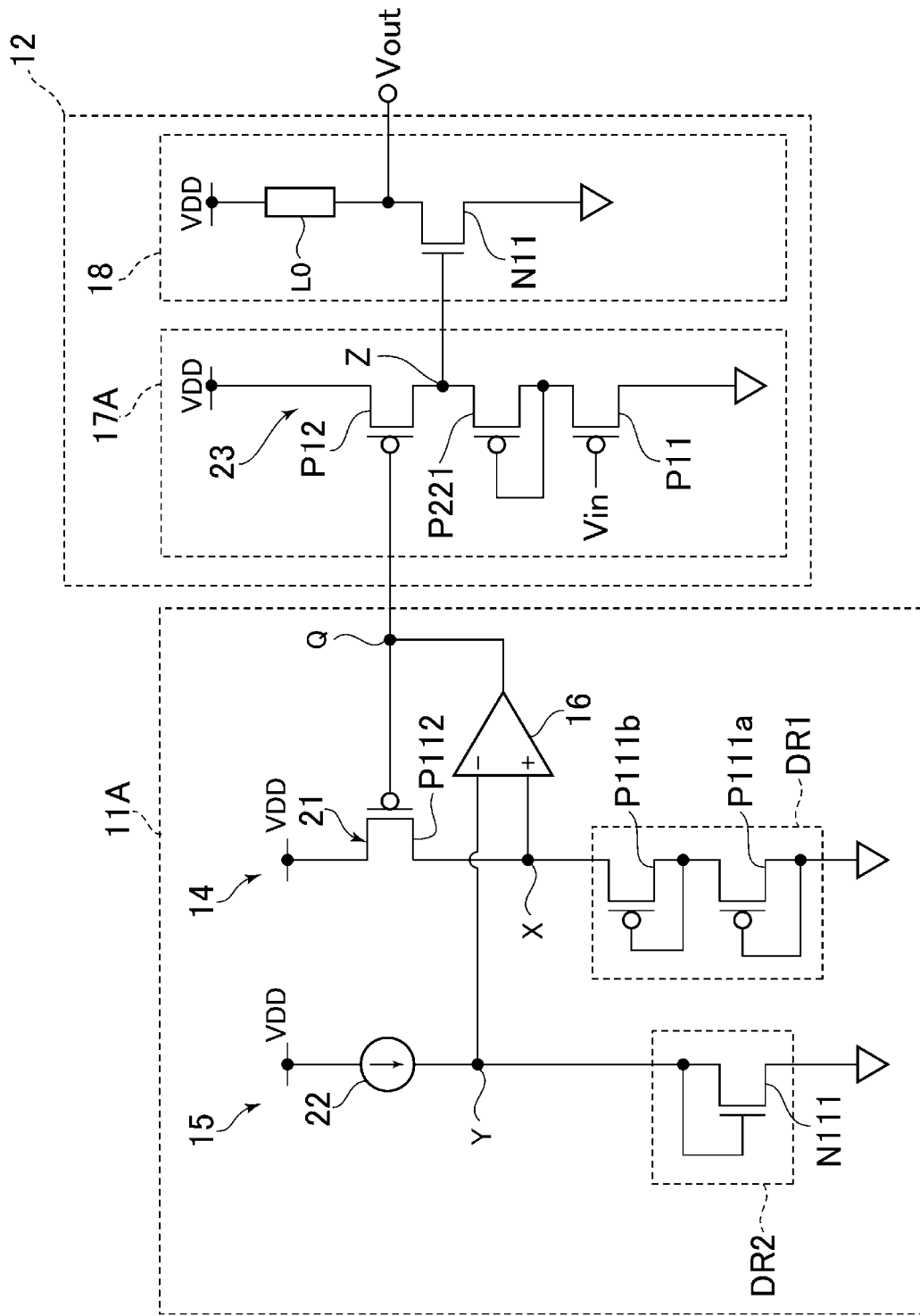
FIG. 6C is a circuit diagram illustrating a circuit configuration of an amplification apparatus using the first voltage dropping portion including a plurality of transistors connected in series.

It is also possible to appropriately provide circuit elements for operating potential matching among circuits. For example, as shown in FIG. 6C, when the circuit configuration shown in FIG. 6A is used as a bias circuit 11A, a source follower stage 17A with a circuit configuration in which a diode-connected p-MOSFET transistor P221 is provided between the transistor P12 and the transistor P11 is used in the amplification circuit 12. In this example, an input potential of the amplification stage 18 is adjusted by the transistor P221 to be higher than the threshold voltage of the n-MOS transistor N11.

Furthermore, a resistance may be connected in series to one or both of the first and second transistors. In an example shown in FIG. 7, resistances Ra, Rb are connected in series to the transistor P111 as the first transistor and the transistor N111 as the second transistor, respectively. In this case, the resistance Ra as a first resistance element and the transistor P111 constitutes the first voltage dropping portion DR1, and the resistance Rb as a second resistance element and the transistor N111 constitutes the second voltage dropping portion DR2. A connection position between the resistance Ra and the drain of the transistor P112 is the connection point X, and a connection position between the resistance Rb and the output terminal of the second current source 22 is the connection point Y.

By connecting the resistances Ra, Rb to the first and second transistors as described above, it is possible to adjust the voltages $V_X$, $V_Y$ of the connection points X and Y high if necessary. In the case of configuring the voltage dropping portions with a plurality of transistors connected in series as in the examples in FIGS. 5 and 6, the voltages $V_X$ and $V_Y$ of the connection points X and Y, respectively, are adjusted in integer multiples of the threshold voltages of the transistors. In the present example using the resistances, however, since resistance values can be set as appropriate, adjustment with a higher degree of freedom becomes possible.

Figure 7:
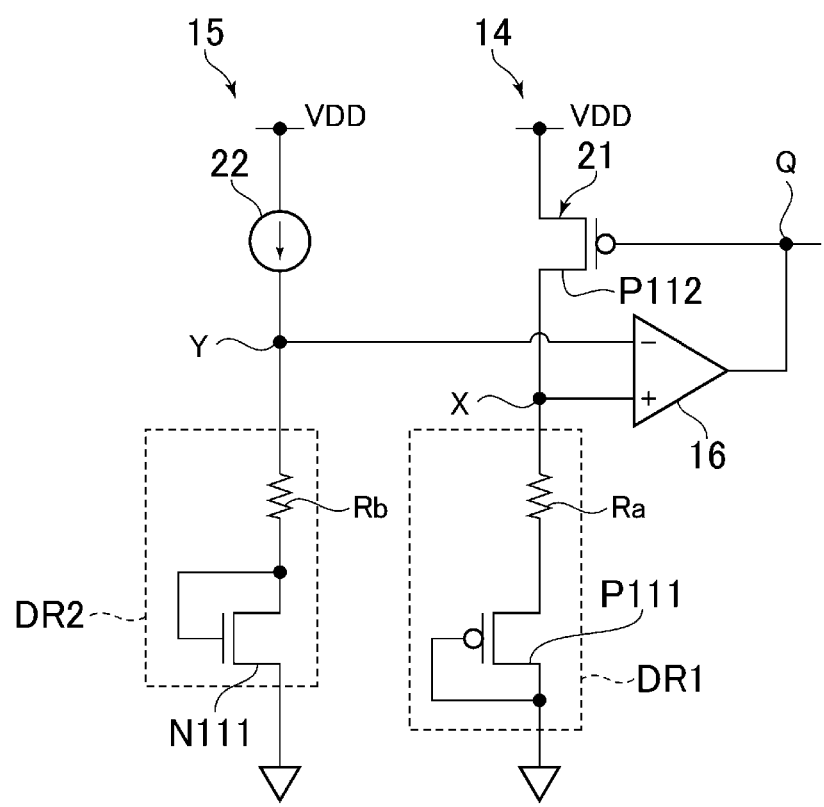
FIG. 7 is a circuit diagram illustrating an example in which each of the first and second voltage dropping portions includes a resistance and a transistor connected in series.

In the example in FIG. 7, since the resistances Ra and Rb are provided between two inputs of the voltage comparator 16 and the ground, influence by characteristic fluctuations of the resistance elements is small. For example, even when resistance values of the resistances Ra and Rb become larger than original values, influence thereof is reduced because both of the voltages $V_X$ and $V_Y$ of the connection points X and Y connected to the two inputs of the voltage comparator 16 increase higher than original values. That is, such a circuit configuration provided with resistance elements as described above is also not easily influenced by fluctuations of the resistance elements.

Figure 8:
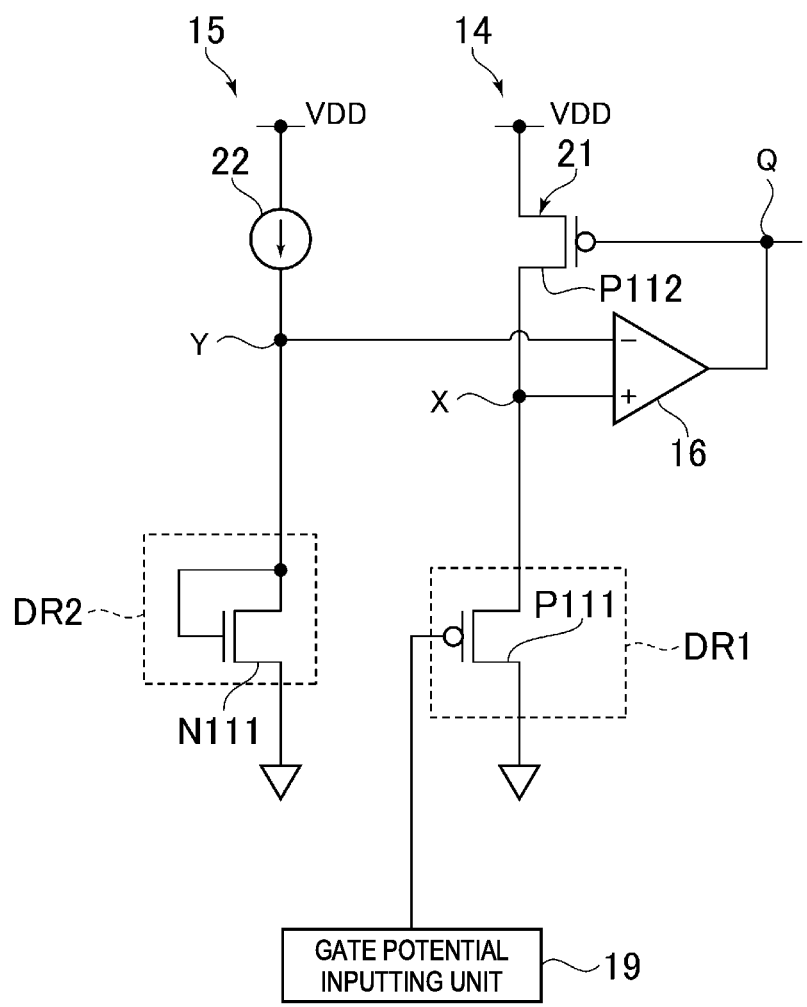
FIG. 8 is a circuit diagram illustrating an example of giving an amplitude center potential of an input signal to a first transistor.

The same electric potential as an amplitude center potential of an input signal to the amplification circuit may be given to the gate of the first transistor. In an example shown in FIG. 8, the amplitude center potential of an input signal is set in advance for a gate potential inputting unit (a gate voltage applying unit) 19. The amplitude center potential of an input signal is given from this gate potential inputting unit 19 to the gate of P111 as the first transistor, and a center voltage of an amplitude of an input signal voltage is applied to the gate. By doing so, it is possible to cause a drain voltage ratio between the transistors P111 and P112 in FIG. 8 to correspond exactly to a drain voltage ratio between the transistors P11 and P12 in the amplification circuit 12 at a center of the input signal voltage Vin. As a result, even when an electric potential of the input signal voltage Vin of the amplification circuit 12 is somewhat higher than the ground level, Formula D above strictly holds. As a result, even when the input signal voltage Vin is somewhat high, it is possible to sufficiently suppress influence of process variation.

Figure 9:
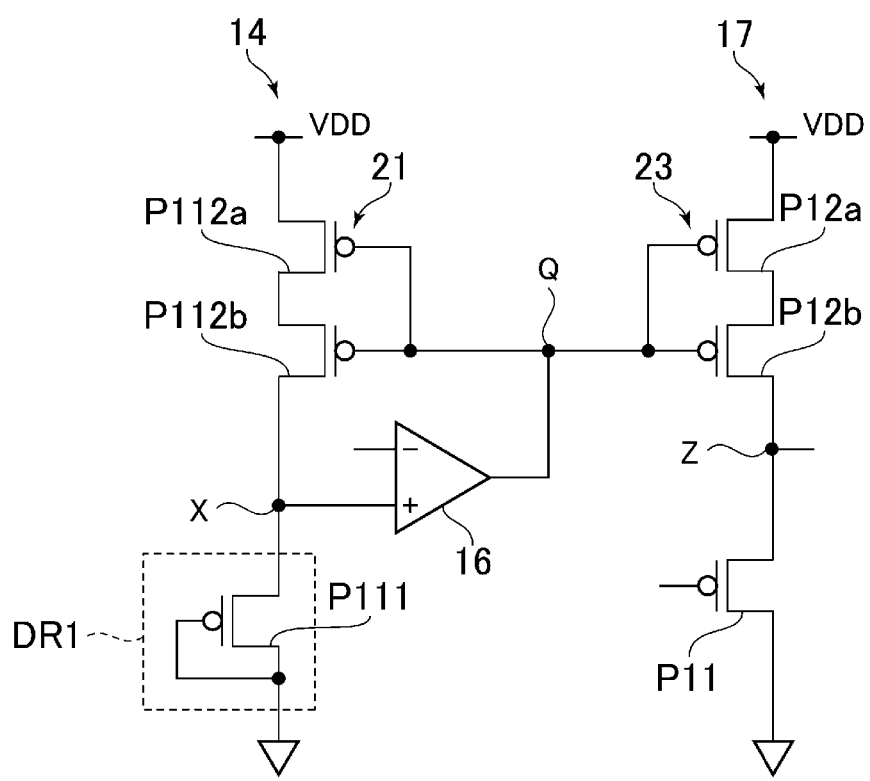
FIG. 9 is a circuit diagram illustrating an example in which each of first and third current sources includes two transistors connected in series.

Each of the first and third current sources may include a plurality of transistors connected in series. In an example shown in FIG. 9, the first current source 21 includes two transistors P112*a* and P112*b* connected in series, and the third current source 23 includes two transistors P12a and P12b connected in series. In the first current source 21, a source of the transistor P112a is connected to the power supply terminal, a drain of the transistor P112a and a source of the transistor P112b are connected, and a drain of the transistor P112b is connected to the source of the transistor P111. In the third current source 23, a source of the transistor P12a is connected to the power supply terminal, a drain of the transistor P12a and a source of the transistor P12b are connected, and a drain of the transistor P12b is connected to the source of the transistor P11. A gate of each of the transistors 12a, 12b, P112a, P112b is connected to the output terminal of the voltage comparator 16, and the bias voltage Vq is applied as a gate voltage. Doing so is equivalent to configuring the first current source 21 and the third current source 23 with MOS transistors with an effectively long gate length, and, therefore, an output impedance of each of the current sources 21, 23 is improved. In other words, a current flowing through each of the current sources 21, 23 is not easily susceptible to influence of the power source voltage VDD, and it becomes possible to obtain a stable amplification action not depending on the power source voltage VDD in the amplification circuit 12.

Second Embodiment

A second embodiment is directed to differential amplification performed in an amplification stage of an amplification apparatus. The second embodiment is similar to the first embodiment except for the explanation below. The same reference signs will be used to designate the same elements with those of the first embodiment, and detailed explanation thereof will be omitted.

Figure 10:
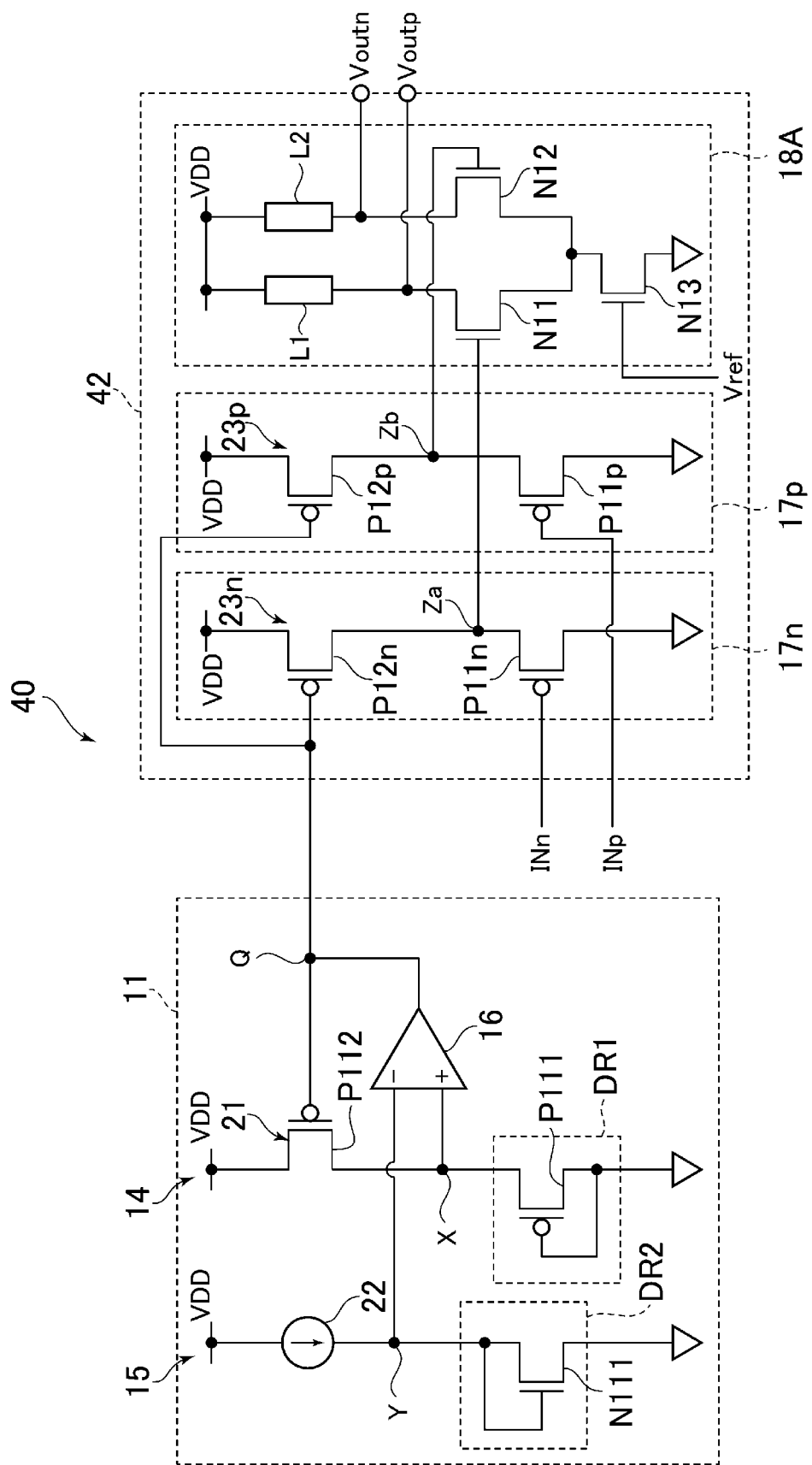
FIG. 10 is a circuit diagram illustrating a circuit configuration of an amplification apparatus of a second embodiment.

An amplification apparatus 40 shown in FIG. 10 is provided with the bias circuit 11 and an amplification circuit 42. A configuration of the bias circuit 11 is the same as that of the first embodiment. Differential input signals INn and INp are inputted to the amplification circuit 42. The amplification circuit 42 is provided with a pair of source follower stages 17n and 17p, and an amplification stage 18A. A configuration of each of the source follower stages 17n and 17p is similar to the source follower stage 17 of the first embodiment. The source follower stage 17n includes transistors P12n and P11n, and the source follower stage 17p includes transistors P12p and P11p, corresponding to the transistors P11 and P12 of the source follower stage 17.

In the source follower stages 17n and 17p, each of gates of the transistors P12n and P12p is connected to the connection point Q so that the transistors P12n and p12p operate as third current sources 23n and 23p, respectively, and the bias voltage Vq of the connection point Q is applied. The differential input signal INn is inputted to the gate of the transistor P11n, and the differential input signal INp is inputted to the gate of the transistor P11p. Thereby, the source follower stage 17n shifts an electric potential of the differential input signal INn and outputs the electric potential from a connection point Za to the amplification stage 18A, and the source follower stage 17p shifts an electric potential of the differential input signal INp and outputs the electric potential from a connection point Zb to the amplification stage 18A.

The amplification stage 18A includes loads L1 and L2, transistors N11 and N12 and a transistor N13 as a tail current source. All of the transistors N11 to N13 are n-MOSFETs. One terminal of the load L1 is connected to the power supply terminal, and the other terminal is connected to the drain of the transistor N11. The source of the transistor N11 is connected to a drain of the transistor N13. One terminal of the load L2 is connected to the power supply terminal, and the other terminal is connected to a drain of the transistor N12. A source of the transistor N12 is connected to the drain of the transistor N13. A source of the transistor N13 is grounded, and a reference voltage Vref is inputted to its gate.

The connection point Za between a source of the transistor P11n and the transistor P12n in the source follower stage 17n is connected to the gate of the transistor N11, and a voltage $V_{Za}$ of the connection point Za is applied to the transistor N11 as a gate voltage. The connection point Zb between a source of the transistor P11p and the transistor P12p in the source follower stage 17p is connected to a gate of the transistor N12, and a voltage $V_{Zb}$ of the connection point Zb is applied to the transistor N12 as a gate voltage. The amplification stage 18A connected as described above outputs, to a pair of output terminals, Voutn and Voutp obtained by amplifying a voltage difference between the differential input signals INn and INp that have been level-shifted by the source follower stages 17n and 17p.

According to the above configuration, since the bias voltage Vq is supplied to each of the source follower stages 17n and 17p, a current according to the bias voltage Vq flows through each of the source follower stages 17n and 17p. Under this current, the source follower stages 17n and 17p shift the electric potentials of the differential input signals INn and INp, respectively, and input the electric potentials to the subsequent amplification stage 18A. Thereby, even if there are fluctuations in characteristics of the p-MOSFET transistors P11n and 11p in the source follower stages 17n and 17p and the n-MOSFET transistors N11 and N12 in the amplification stage 18 due to process variation and the like, such favorable differential amplification that characteristic fluctuations of the amplification circuit 42 are suppressed is performed.

Figure 11:
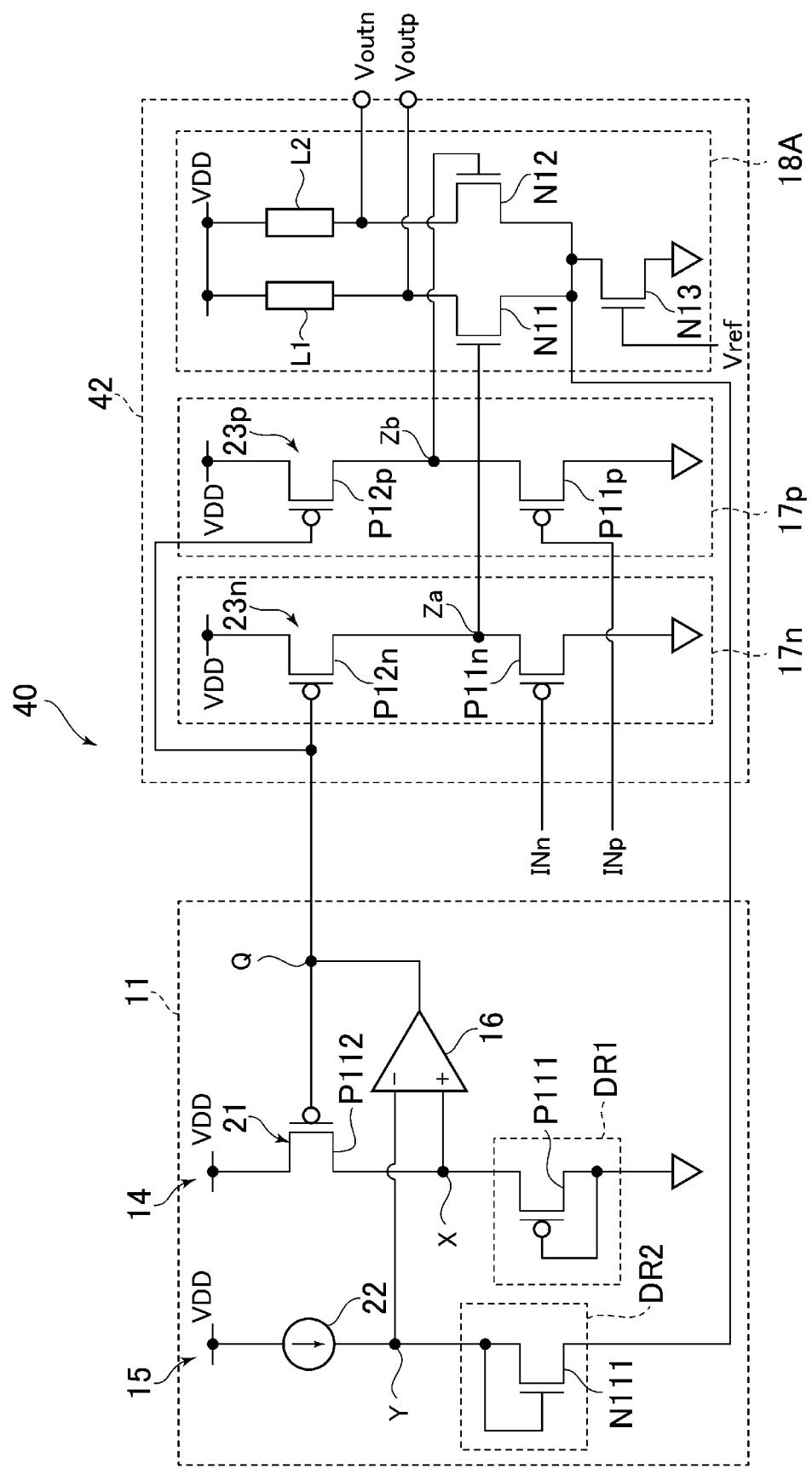
FIG. 11 is a circuit diagram illustrating an example in which sources of a differential pair of transistors in an amplification stage are connected to a source of the second voltage dropping portion of transistors.

In the amplification stage 18A described above, voltage drop by the transistor N13 as a tail current source occurs, and electric potentials of the sources of the transistor N11 and N12 are higher than the ground. Therefore, it is recommended that the source of the transistor N111 of the second voltage outputting unit is connected to the drain of the transistor N13 together with the sources of the transistors N11, N12 as shown in FIG. 11 to cause the sources of the transistors N11, N12, N111 to be equipotential. By doing so, it is possible to enhance accuracy of suppressing fluctuations of output of the amplification apparatus 10 due to process variation and the like.

Figure 12:
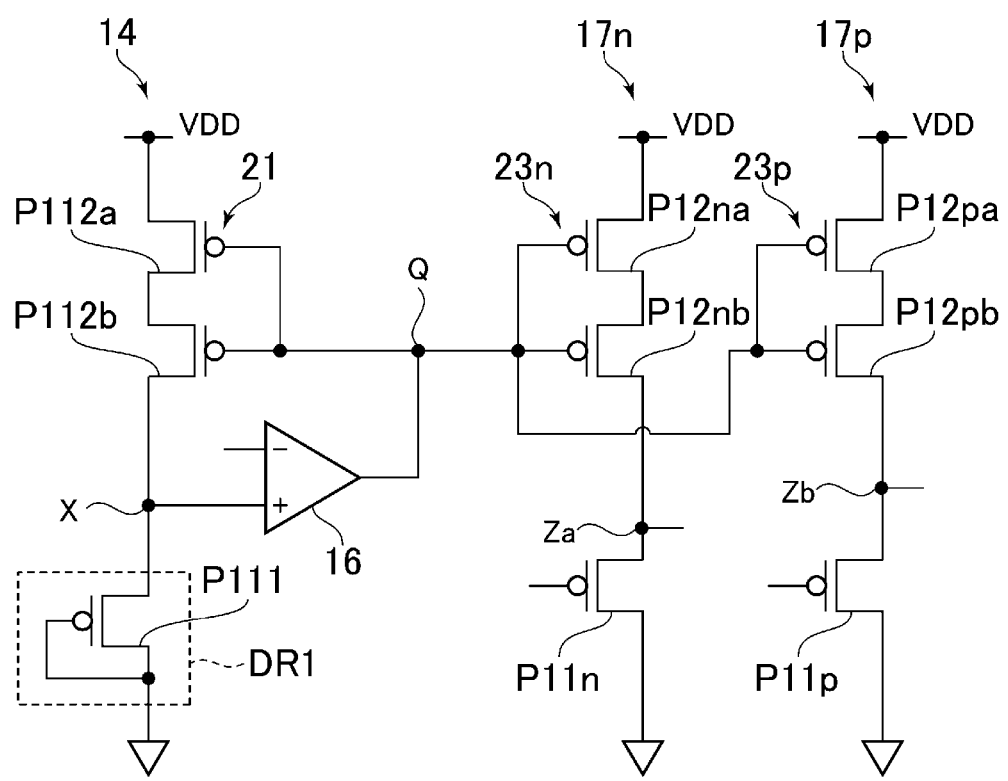
FIG. 12 is a circuit diagram illustrating an example in which each of the first and third current sources includes two transistors connected in series.

In the case where an amplification stage is configured as a differential amplification circuit as described above, each of the first current source 21 and the third current sources 23n and 23p can also include a plurality of transistors connected in series as exemplified in FIG. 12. In the third current source 23n, transistors P12na, P12nb are connected in series. In the third current source 23p, transistors P12pa, P12pb are connected in series. By doing so, a current flowing through each of the current sources 21, 23n, 23p is not easily susceptible to influence of the power source voltage VDD, and it is possible to obtain a stable amplification operation not depending on the power source voltage VDD in the amplification circuit 42.

Third Embodiment

A third embodiment is directed to an amplification apparatus used for a power source apparatus (a voltage regulator). The third embodiment is similar to the second embodiment except for the explanation below. The same reference signs will be used to designate the same elements with those of the second embodiment, and detailed explanation thereof will be omitted.

Figure 13:
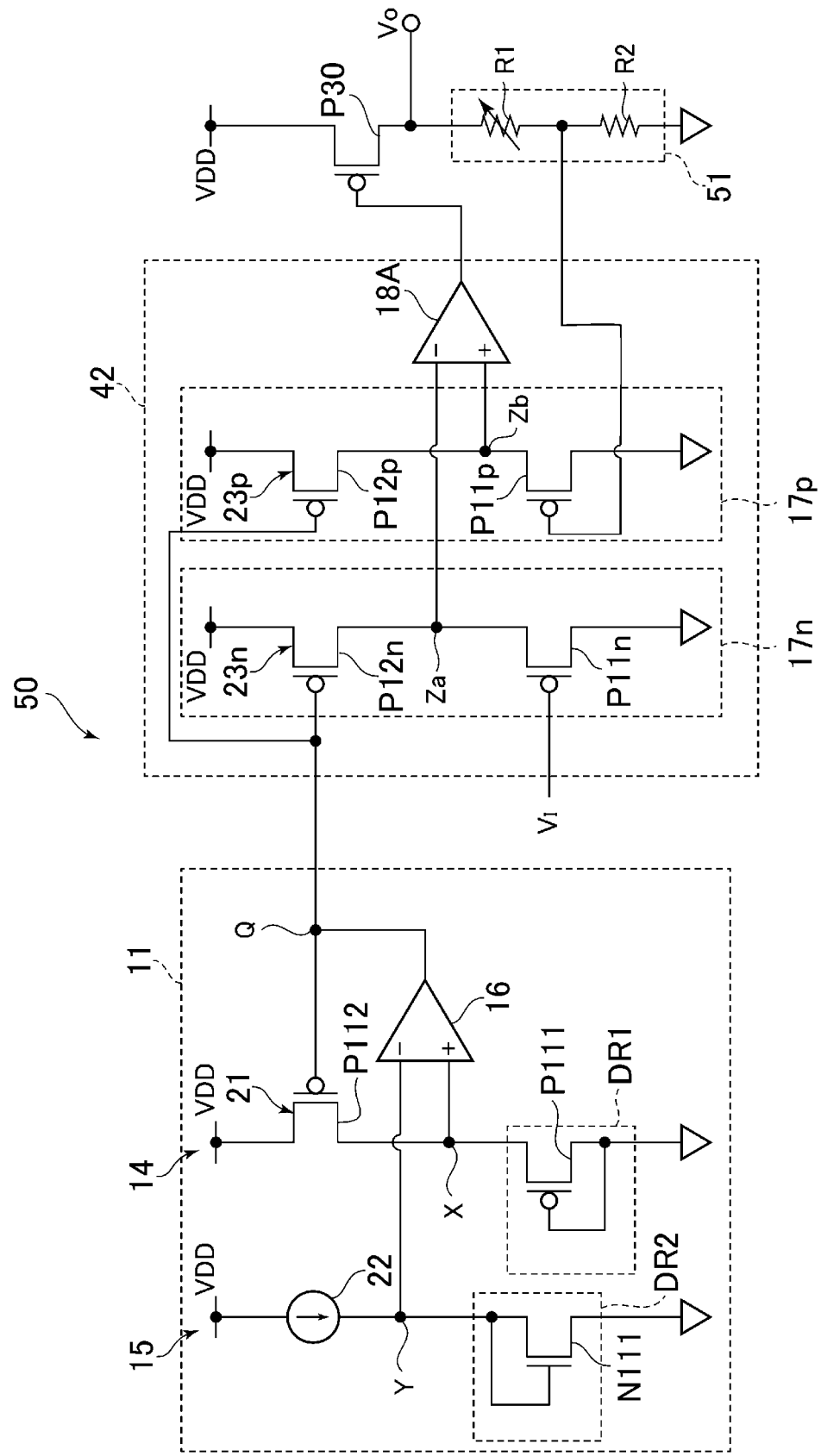
FIG. 13 is a circuit diagram illustrating a circuit configuration of a power source apparatus of a third embodiment.

As shown in FIG. 13, a power source apparatus 50 in this example is provided with the bias circuit 11, the amplification circuit 42, an output control transistor P30 and a voltage divider circuit 51, and outputs a constant output voltage Vo according to a reference voltage $V_I$. The reference voltage $V_I$ is given as a gate voltage of the transistor P11n of the source follower stage 17n of the amplification circuit 42, and the reference voltage $V_I$ is inputted to an inverting input terminal of the amplification stage 18A constituting a differential amplification circuit via the connection point Za of the source follower stage 17n. The amplification stage 18A functions as an inverting amplification circuit for an electric potential of the connection point Za, and a gate of the output control transistor P30 is connected to an output terminal of the amplification stage 18A. As the output control transistor P30, a p-MOSFET is used. The power supply terminal is connected to a source of the output control transistor P30, and its drain is an output terminal of the power source apparatus 50 and outputs the output voltage Vo.

Further, the voltage divider circuit 51 is connected to the drain of the output control transistor P30. The voltage divider circuit 51 includes resistance elements R1 and R2 connected in series. One terminal of the resistance element R1 is connected to the drain of the output control transistor P30, and the other terminal is connected to one terminal of the resistance element R2. The other terminal of the resistance element R2 is grounded. A connection point between the resistance elements R1 and R2 is connected to the gate of the transistor P11p of the source follower stage 17p, and a feedback voltage obtained by dividing the output voltage Vo is inputted to a non-inverting input terminal of the amplification stage 18A via the source follower stage 17p.

The power source apparatus 50 connected as described above constitutes a so-called voltage regulator. The power source apparatus 50 controls ON-resistance of the output control transistor P30 based on the feedback voltage obtained by dividing the output voltage Vo, and keeps the output voltage Vo constant by increasing/decreasing a current of the output control transistor P30. In the power source apparatus 50 as described above, the characteristic fluctuations of each of the n-MOSFET and the p-MOSFET due to process variation and the like easily influence the output voltage Vo. Therefore, it is especially favorable to use the bias circuit 11 that supplies the bias voltage Vq that is in correlation with both of the p-MOSFET and n-MOSFET characteristic fluctuations.

In a case where the reference voltage $V_I$ in FIG. 13 is low, and a resistance value of the resistance element R1 is small relative to the resistance element R2, the output control transistor P30 is to operate in a saturation region, and the power source apparatus 50 operates as a so-called step-down circuit. In a case where the reference voltage $V_I$ is high, and the resistance value of the resistance element R1 is relatively large relative to the resistance element R2, the output control transistor P30 is to operate in a linear region, and the power source apparatus 50 operates as a so-called low drop-out (LDO) voltage regulator.

Though a description has been made on the case where p-MOSFETs are MOSFETs with the first polarity and n-MOSFETs are MOSFETs with the second polarity, respectively, in each of the above embodiments, it is also possible to make a configuration with n-MOSFETs are the MOSFETs with the first polarity and p-MOSFETs are the MOSFETs with the second polarity used as n-MOSFETs and p-MOSFETs, respectively. In this case, the p-MOSFETs and the n-MOSFETs are exchanged, and the power source voltage VDD and the ground are exchanged, and they are appropriately connected.

In order to examine an effect of process variation, first to fifth simulations were performed by SPICE (Simulation Program with Integrated Circuit Emphasis).

[First Simulation]

In the first simulation, on an assumption that each of the n-MOSFET and the p-MOSFET is either Fast or Slow in the configuration of the power source apparatus 50 shown in FIG. 13, so-called four corner simulations were performed in which simulations are performed for four combinations of Fast and Slow for the n-MOSFET and the p-MOSFET, to examine fluctuations of the output voltage Vo.

In the first simulation, parameters were set on an assumption of a case where each of the n-MOSFET and p-MOSFET transistors constituting the power source apparatus 50 is a planar MOSFET. In the first simulation, first, a 90-nm planar MOSFET model (BSIM) was adopted as a device model of a Typical MOSFET without process variation first, and the parameters for the device model were used. The gate length L of each of the transistors constituting the power source apparatus 50 was set to 100 nm.

In order to simulate process corner characteristics, a fluctuation amount ΔVth0 of a SPICE parameter Vth0 determining a threshold voltage was set for each corner (Fast, Slow) as shown in Table 1 below. As for a current value (a drain current) at each corner, the current value was determined by multiplying a current value of each transistor by a proportional coefficient Km. As shown in Table 1, Km=1 was set when the process is Typical; Km=1.1 was set when the process is Fast: and Km=0.9 was set when the process is Slow.

TABLE 1

|  |  | Fast | Slow | Remarks |
|---|---|---|---|---|
| NMOS | Δ Vth0 (mV) | −80 | 80 |  |
|  | Km | 1.1 | 0.9 |  |
|  | Δ Vt (mV) | −86 | 87 | 0.1 μA/μm |
|  | Δ Ids (%) | 46 | −38 | Vgs = Vds = 0.8 V |
| PMOS | Δ Vth0 (mV) | 80 | −80 |  |
|  | Km | 1.1 | 0.9 |  |
|  | Δ Vt (mV) | 90 | −91 | 0.1 μA/μm |
|  | Δ Ids (%) | 60 | −44 | Vgs = Vds = 0.8 V |

As described above, the threshold voltage of the n-MOSFET is positive. When the fluctuation amount ΔVth0 of the threshold voltage is negative, the threshold voltage decreases, and the characteristic becomes Fast. When the fluctuation amount ΔVth0 is positive, the threshold voltage increases, and the characteristic becomes Slow. On the contrary, the threshold voltage of the p-MOSFET is negative. If the fluctuation amount ΔVth0 of the threshold voltage is positive, an absolute value of the threshold voltage decreases, and the characteristic becomes Fast. If the fluctuation amount ΔVth0 is negative, the absolute value of the threshold voltage increases, and the characteristic becomes Slow.

In Table 1 above, ΔVt indicates a fluctuation amount of the threshold voltage calculated based on a result of a simulation of each transistor alone. At this time, the fluctuation amount of the threshold voltage is determined on an assumption that the gate width W is 1 μm, and a gate voltage when the drain current of 0.1 μA flows is the threshold voltage. It is meant that, in the case of the p-MOS, the absolute value of the threshold voltage decreases if ΔVt is positive, and the characteristic becomes Fast, and that the absolute value of the threshold voltage increases if the fluctuation amount ΔVt is negative, and the characteristic becomes Slow. Further, ΔIds indicates a rate of a drain current that flows through each of the MOSFETs that are Fast or Slow relative to a drain current that flows through the Typical MOSFET when the gate voltage and the drain voltage are 0.8 V. In Table 1, a case where the drain current increases relative to the drain current that flows through the Typical MOSFET is indicated by a positive value, and a case where the drain current decreases is indicated by a negative value.

ΔVt and ΔIds in Table 1 and Formula (B) suggest that the proportional coefficient Km by which the threshold voltage and the current value are to be multiplied is set such that characteristics of a MOSFET becomes Fast or Slow, and the gain coefficient K of the MOSFET fluctuates relative to a gain coefficient of a MOSFET the characteristics of which is Typical, in this simulation.

The first simulation was performed under conditions of: the power source voltage VDD=0.8 V, the reference voltage $V_I$=0.12 V, the resistance value r1 of the resistance element R1=2 kΩ, the resistance value r2 of the resistance element R2=48 kΩ, and temperature T=25° C. An ideal value of the output voltage Vo of the power source apparatus 50 is calculated by "Vo=(1+r1/r2)$V_I$", and the ideal value of the output voltage Vo is 0.125 V. Furthermore, an assumption is made that each of the transistors constituting the circuit operates in a saturation region. The same conditions are used for the second to fifth simulations.

As can be seen from the formula of the ideal value of the output voltage Vo, the output voltage Vo is not influenced by fluctuations of the resistance elements. This is because a resistance element is not included in the amplification circuit 42, and, when the resistance value r1 of the resistance element R1 fluctuates, the resistance value r2 of the resistance element R2 also fluctuates at the same rate.

Figure 14:
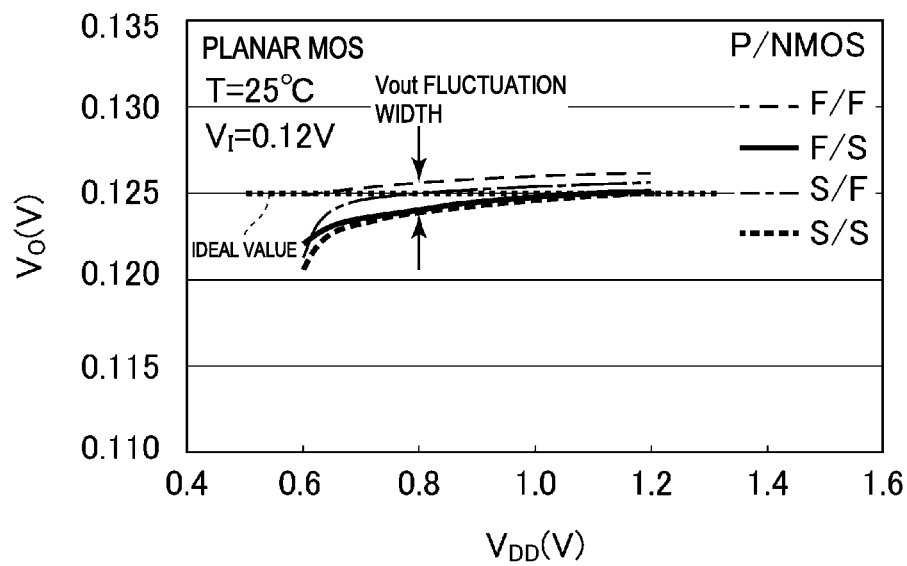
FIG. 14 is a graph illustrating results of simulating influence of process variation on change in an output voltage relative to a power source voltage in the case of a planar MOSFET.

The result of the first simulation is shown in FIG. 14. A horizontal axis of a graph in FIG. 14 indicates the power source voltage VDD; a vertical axis of the graph indicates the output voltage Vo; Fast and Slow of corners are abbreviated as F and S, respectively; and characteristics at four process corners of P/NMOS=F/F, F/S, S/F, S/S are shown. The same goes for graphs in FIGS. 16 to 17 to be described later.

In this first simulation, the voltage comparator 16 works in the bias circuit 11, and the bias voltage Vq is determined so that the voltage $V_X$ from the first voltage outputting unit 14 including the p-MOSFET transistor P111 and the voltage $V_Y$ from the second voltage outputting unit 15 including the n-MOSFET transistor N111 become equal to each other. Therefore, even when characteristics of the p-MOSFET and the n-MOSFET fluctuate in an inverse correlation, characteristic change in the amplification circuit 42 is suppressed, and fluctuations of the output voltage Vo of the power source apparatus 50 are also suppressed. A hump of an output voltage characteristic seen in the third simulation to be described later is eliminated, and influence by fluctuations of the power source voltage VDD is also reduced.

A rate of a fluctuation width of the output voltage Vo due to process variation relative to an ideal value (=fluctuation width/ideal value×100(%)) was 1.2% relative to 0.125 V, the ideal value of Vo. This result is shown in Table 2 below together with results of the other simulations to be described later. As can be seen from Table 1, the rate of the fluctuation width relative to the ideal value in the first simulation is ¼ or less of a result of the third simulation described later. Thus, the power source apparatus 50 using the bias circuit 11 can suppresses an adverse effect of characteristic fluctuations in which the characteristics of the p-MOSFET and the n-MOSFET are inverse correlation.

TABLE 2

| | Bias circuit | MOSFET structure | Rate of fluctuation width to ideal value | Simulation result | Conditions |
|---|---|---|---|---|---|
| 1st simulation | Bias circuit 11 (Circuit of the present invention) | Planar | 1.2% | FIG. 14 | VDD = 0.8 V T = 25° C. $V_I$ = 0.12 V r1 = 2 kΩ r2 = 48 kΩ |
| 2nd simulation | Bias circuit 11 (Circuit of the present invention) | Vertical BC | 0.5% | FIG. 16 | |
| 3rd simulation | Bias circuit 61 (Conventional circuit) | Planar | 4.9% | FIG. 17 | |
| 4th simulation | Bias circuit 11 (Resistance element instead of transistor P111) | Planar | 5.3% | FIG. 18 | |
| 5th simulation | Bias Circuit 11 (Resistance element instead of transistor N111) | Planar | 3.8% | FIG. 19 | |

[Second Simulation]

Figure 3:
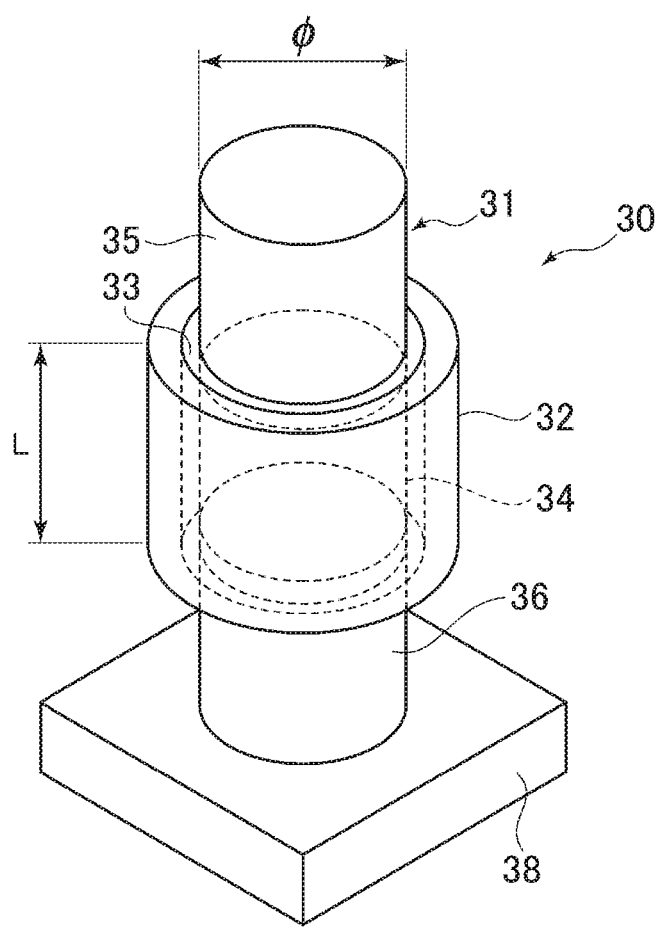
FIG. 3 is a perspective view illustrating an external appearance of a vertical BC-MOSFET.

In the second simulation, parameters were set on an assumption of a case where each of the n-MOSFET and p-MOSFET transistors constituting the power source apparatus 50 is a vertical BC-MOSFET as shown in FIG. 3. Similarly to the first simulation, four corner simulations were performed to examine fluctuations of the output voltage Vo.

Figure 15:
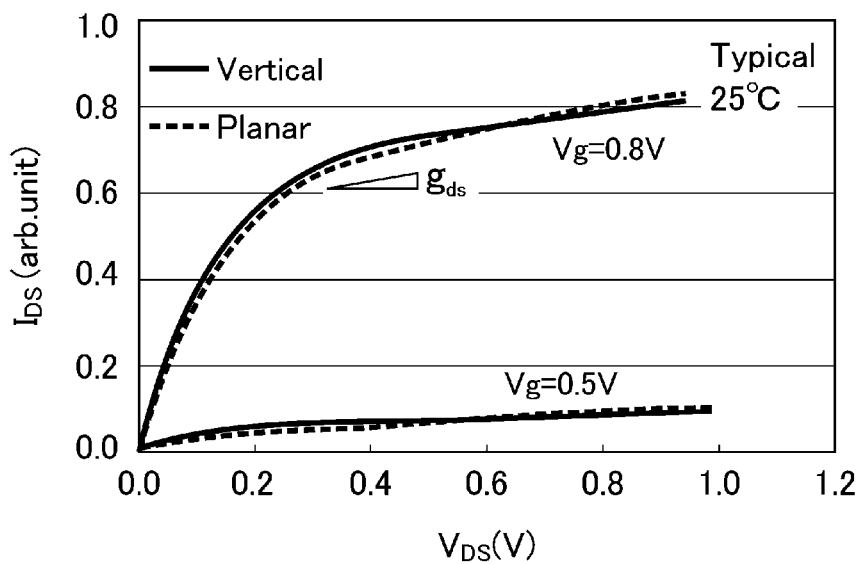
FIG. 15 is a graph illustrating characteristics of a vertical BC-MOSFET used in the simulations.

In the simulation of the circuit by vertical BC-MOSFETs, characteristics of the vertical BC-MOSFETs were approximated as below in accordance with Non Patent Literature 1. First, a vertical BC-MOSFET with a large semiconductor pillar diameter φ shows a drain current value that is almost equal to that of a planar MOSFET with the same gate width W and gate length L. In contrast, a small vertical BC-MOSFET with a semiconductor pillar diameter φ of about 10 nm shows a drain current value that is twice as large as a drain current value of a planar MOSFET with the same gate width W and gate length L. From the above, an assumption is made that a drain current of a vertical BC- MOSFET with a semiconductor pillar diameter φ and gate length L of about 100 nm is almost the same as that of a planar transistor with the same gate width W and gate length L. Since a vertical BC-MOSFET can suppress the short channel effect, an output impedance $r_{out}(=1/g_{ds})$ of the vertical BC-MOSFET can be approximated as almost twice that of a planar MOSFET if the gate length L is within a region of 100 nm or less. An example of IDS-VDS characteristics at gate voltages Vg of 0.5 V and 0.8 V approximated as described above is shown in FIG. 15. In FIG. 15, IDS-VDS characteristics of planar MOSFETs (Planar) are also shown together with IDS-VDS characteristics of the vertical BC-MOSFETs (Vertical). In the second simulation, the approximated characteristics described above were used as the characteristics of the vertical BC-MOSFETs.

Figure 16:
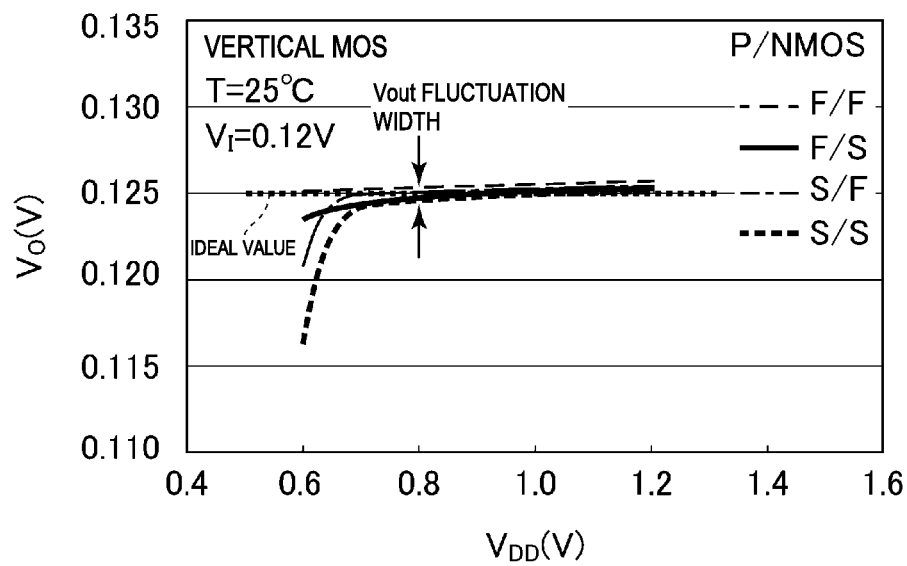
FIG. 16 is a graph illustrating results of simulating influence of process variation on change in an output voltage relative to a power source voltage in the case of the vertical BC-MOSFET.

The result of the second simulation using the vertical BC-MOSFETs is shown in FIG. 16. In the case where the vertical BC-MOSFETs are used, the rate of the fluctuation width of the output voltage Vo relative to the ideal value is 0.5%, which is about one digit smaller in comparison with a rate of the third simulation to be described later. Thus, the vertical BC-MOSFETs have a high output impedance $r_{out}$, and, therefore, a gain of an amplifier constituting the voltage comparator 16 is enhanced. Since performance of the voltage comparator 16 that controls an electric potential of the connection point Q has a great influence in suppressing the fluctuation width of the output voltage Vo, significant improvement of characteristics becomes possible by adopting the vertical BC-MOSFETs.

[Third Simulation]

Figure 17:
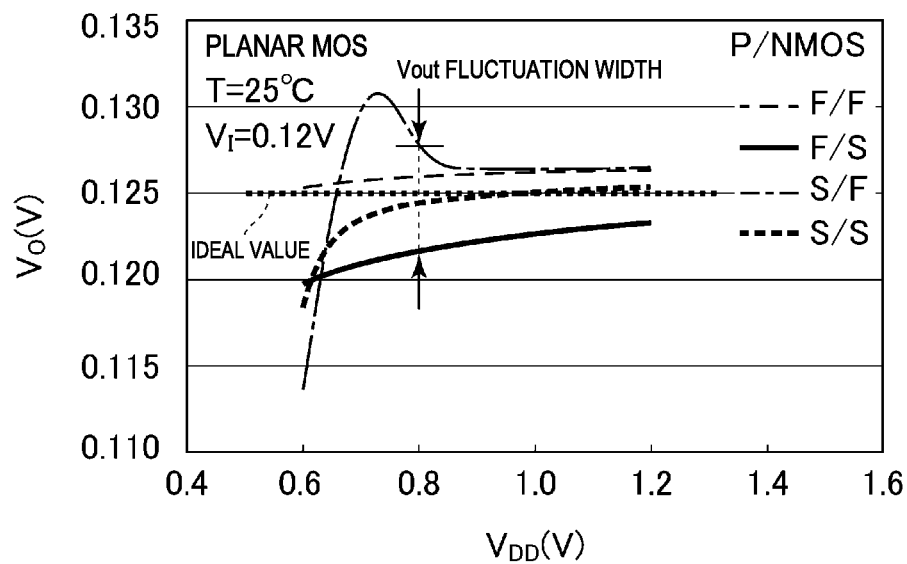
FIG. 17 is a graph illustrating results of simulating influence of process variation on change in an output voltage relative to a power source voltage in the case of using a conventional bias circuit.

In the third simulation, the conventional bias circuit 61 shown in FIG. 20 was used instead of the bias circuit 11 of the power source apparatus 50 shown in FIG. 13. That is, the bias circuit 61 in which the constant current source CS is connected in series to the p-MOSFET transistor P61 is used, and a configuration is made in which a gate of the transistor P61 of the bias circuit 61 is connected to the gates of the transistors P12n, P12p of the source follower stages 17n, 17p of the amplification circuit 42. The four corner simulations were performed with this configuration to examine fluctuations of the output voltage Vo. In this third simulation, a planar MOSFET is used as each transistor similarly to the first simulation. The result of the third simulation is shown in FIG. 17.

The third simulation shows that, when the bias circuit 61 is used, the output voltage Vo strongly depends on the power source voltage VDD and a process state. Further, in the case of P/NMOS=S/F, a hump is seen in an output voltage characteristic in a region where the power source voltage VDD is low. It is because of the following reason that the hump is seen in the output voltage characteristic as described above. In the case of P/NMOS=S/F, electric potentials of voltages $V_{za}$, $V_{zb}$ from the source follower stages 17n, 17p are kept high when the power source voltage VDD drops. Therefore, an output potential of the amplification stage 18A decreases, and a drain current of the output control transistor P30 becomes excessive in comparison with the case of P/NMOS=T/T. This phenomenon becomes more remarkable as the power source voltage VDD is lower. When the power source voltage VDD is much lower, and the output control transistor P30 comes close to an OFF state, the output voltage Vo drops, and a hump characteristic appears.

As described above, when absolute values of threshold voltages of the p-MOSFET and the n-MOSFET fluctuate in an inverse correlation in the conventional bias circuit 61, the output value Vo greatly fluctuates. Furthermore, since the characteristic of having a hump is shown, a fluctuation width of an output voltage becomes very large due to process variation and fluctuations of the power source voltage VDD. In the third simulation, the rate of the fluctuation width of the output voltage Vo relative to the ideal value was 4.9%.

[Fourth Simulation]

In the fourth simulation, the four corner simulations were performed for a case where a resistance element (hereinafter referred to as a first substitute resistance element) is connected instead of the transistor P111 of the bias circuit 11 of the power source apparatus 50 shown in FIG. 13 as a configuration considering only characteristic fluctuations of the n-MOSFET with one polarity, to examine fluctuations of the output voltage Vo. In this fourth simulation, a planar MOSFET is used as each transistor similarly to the first simulation.

In the circuit configuration of the fourth simulation, when the threshold voltage of the n-MOSFET increases, fluctuations of the output voltage Vo are suppressed by the electric potentials $V_{Za}$, $V_{Zb}$ of the connection points Za, Zb increasing. However, influence by fluctuations of the threshold voltage of the p-MOSFET is not suppressed. Furthermore, characteristics of the first substitute resistance element commonly fluctuate independently from any of n-MOSFET and p-MOSFET transistors.

For example, when the first substitute resistance element is formed by polysilicon without silicide, a resistance value of the first substitute resistance element decreases as impurity concentration of the polysilicon increases. Since silicided polysilicon is generally used for a gate of a MOSFET, influence of the impurity concentration of the polysilicon on characteristics of the MOSFET is small. Here, if an amount of dose for p-MOSFET threshold control ion implantation and an amount of dose for n-MOSFET threshold control ion implantation fluctuate in opposite directions, it may happen that the p-MOSFET characteristic becomes Slow, and the n-MOSFET characteristic becomes Fast. Thus, increase and decrease in the resistance value of the first substitute resistance element according to process variation is independent from the p-MOSFET characteristic fluctuations. In the fourth simulation, simulations were performed by making settings so that the resistance value of the first substitute resistance element increases by 10% when the p-MOSFET is Fast and decreases by 10% when the p-MOSFET is Slow.

Figure 18:
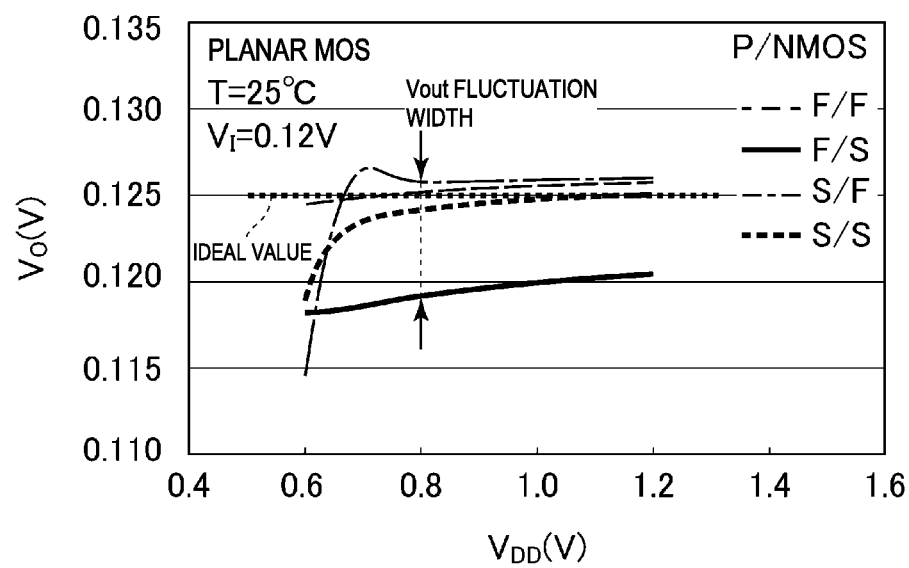
FIG. 18 is a graph illustrating results of simulating influence of process variation on change in an output voltage relative to a power source voltage in the case of connecting a resistance element instead of a transistor of the first voltage dropping portion.

As a result of the fourth simulation is shown in FIG. 18, the hump of the output voltage $V_O$ is reduced in comparison with the third simulation. However, the rate of the fluctuation width of the output voltage Vo relative to the ideal value is 5.3%, and the characteristics have deteriorated in comparison with the third simulation. Thus, in the configuration in which the transistor P111 is replaced with the first substitute resistance element, when the first substitute resistance element fluctuates in an inverse correlation with drain-source equivalent resistance of the p-MOSFET, the characteristics deteriorate.

In the configuration of the fourth simulation, a resistance element is inserted between the non-inverting input terminal of the voltage comparator 16 in the bias circuit 11 and the ground, and a MOSFET is inserted between the inverting input terminal of the voltage comparator 16 and the ground. Therefore, electric potentials of the input terminals of the voltage comparator 16 show different temperature dependences. Therefore, there is a problem that characteristics of the bias circuit 11 become susceptible to influence of temperature fluctuations.

[Fifth Simulation]

The fifth simulation was also performed for a circuit configuration considering only characteristic fluctuations of a transistor with one polarity. In the fifth simulation, simulations were performed for a configuration considering only the fluctuations of the p-MOSFET contrary to the fourth simulation. That is, the four corner simulations were performed for a case where a resistance element (hereinafter referred to as a second substitute resistance element) is connected instead of the transistor N111 of the bias circuit 11 of the power source apparatus 50 shown in FIG. 13, to examine fluctuations of the output voltage Vo. In the fifth simulation, a planar MOSFET is used as each transistor similarly to the first simulation.

In the circuit configuration of the fifth simulation, when an absolute value of the threshold voltage of the p-MOSFET increases, fluctuations of the output voltage Vo are suppressed by the electric potentials $V_{Za}$ and $V_{Zb}$ of the connection points Za and Zb increasing, but influence by fluctuations of the threshold voltage of the n-MOSFET is not suppressed. Furthermore, similarly to the case of the first substitute resistance element in the fourth simulation, characteristics of the second substitute resistance element fluctuate independently from any of n-MOSFET and p-MOSFET transistors. In the fifth simulation, simulations were performed by making settings so that the resistance value of the second substitute resistance element increases by 10% when the n-MOSFET is Fast and decreases by 10% when the n-MOSFET is Slow.

Figure 19:
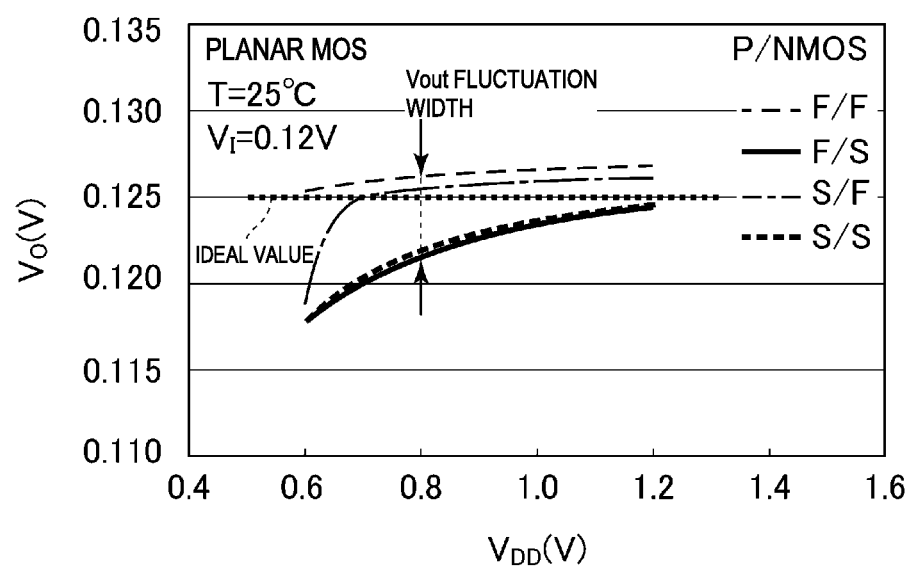
FIG. 19 is a graph illustrating results of simulating influence of process variation on change in an output voltage relative to a power source voltage in the case of connecting a resistance element instead of a transistor of the second voltage dropping portion.

As a result of the fifth simulation is shown in FIG. 19, the characteristics are slightly improved in comparison with the third simulation. However, the rate of the fluctuation width of the output voltage Vo relative to the ideal value is 3.8%, which is only 20 to 30% lower than the output fluctuation width of the third simulation. The suppression effect was insufficient in comparison with those of the first and second simulations.

In the configuration of the fifth simulation, a resistance element is inserted between the inverting input terminal of the voltage comparator 16 in the bias circuit 11 and the ground, and a MOSFET is inserted between the non-inverting input terminal and the ground. Therefore, electric potentials of the input terminals of the voltage comparator 16 show different temperature dependences. Therefore, there is a problem that the characteristics of the bias circuit 11 become susceptible to influence of temperature fluctuations.

As described above, as shown by the results of the first and second simulations, the power source apparatus 50 shows very excellent process variation resistance. In comparison, the results of the third, fourth and fifth simulations show that resistance to process variation is extremely low. Thereby, the bias circuit 11 adopting the circuit configuration of the present invention supplies the bias voltage Vq so as to cause the current $I_{CS3}$ adjusted to compensate characteristic fluctuations of both of the n-MOSFET and the p-MOSFET to flow through each of the source follower stages 17n, 17p.

REFERENCE SIGNS LIST 10, 40 amplification apparatus
11 bias circuit
12, 42 amplification circuit
17 source follower stage
18 amplification stage
50 power source apparatus
DR1, DR2 voltage dropping portion
P11, P12, P111, P112, N11, N12, N111, N112 transistor

The invention claimed is:

1. An amplification apparatus comprising:
a bias circuit for supplying a bias voltage; and
an amplification circuit to which the bias voltage is configured to be supplied from the bias circuit, the bias circuit comprising:
a first voltage outputting unit comprising:
   a first current source configured to increase and decrease a first output current depending on the bias voltage; and
   a first voltage dropping portion including a first transistor which is a MOSFET with a first polarity and through which the first output current from the first current source flows as a drain current,
the first voltage outputting unit being configured to output a first output voltage from a connection point between the first current source and the first voltage dropping portion;
a second voltage outputting unit comprising:
   a second current source configured to output a constant current as a second output current; and
   a second voltage dropping portion including a second transistor which is a MOSFET with a second polarity different from the first polarity and through which the second output current from the second current source flows as a drain current,
the second voltage outputting unit being configured to output a second output voltage from a connection point between the second current source and the second voltage dropping portion; and
a voltage comparator configured to output the bias voltage, and increase and decrease the bias voltage such that the first and second output voltages become equal, based on a difference between the first and second output voltages,
the amplification circuit comprising:
a source follower stage comprising:
   a third current source configured to increase and decrease a third output current depending on the bias voltage; and
   a third transistor which is a MOSFET with the first polarity and has a gate to which an input signal is configured to be inputted, the third output current from the third current source being configured to flow as a drain current through the third transistor; and
an amplification stage comprising a fourth transistor which is a MOSFET with the second polarity and has a gate to which an output of the source follower stage is configured to be inputted, the amplification stage being configured to amplify the output of the source follower stage.

2. The amplification apparatus according to claim 1, wherein
the first transistor is diode-connected, and is connected to an output terminal of the first current source; and
the second transistor is diode-connected, and is connected to an output terminal of the second current source.

3. The amplification apparatus according to claim 1, further comprising a gate voltage applying unit configured to apply, as a gate voltage of the first transistor, a center voltage of an amplitude of the input signal to the amplification circuit.

4. The amplification apparatus according to claim 2, wherein
the first voltage dropping portion comprises a plurality of first transistors connected in series, each of the plurality of first transistors being defined as the first transistor.

5. The amplification apparatus according to claim 2, wherein
the second voltage dropping portion comprises a plurality of second transistors connected in series, each of the plurality of second transistors being defined as the second transistor.

6. The amplification apparatus according to claim 2, wherein
the first voltage dropping portion further comprises a first resistance element connected in series to the first transistor.

7. The amplification apparatus according to claim 2, wherein
the second voltage dropping portion further comprises a second resistance element connected in series to the second transistor.

8. The amplification apparatus according to claim 1, wherein
each of the first, second, third and fourth transistors has a structure comprising:
a semiconductor pillar having a semiconductor region as a channel on a central part, a drain region on one end, and a source region on the other end;
a gate electrode provided around the central part of the semiconductor pillar; and
a gate oxide film provided between the gate electrode and the semiconductor pillar.

9. The amplification apparatus according to claim 1, wherein
the first current source is a fifth transistor that is a MOSFET to which the bias voltage is configured to be applied as a gate voltage, and
the third current source is a sixth transistor that is a MOSFET to which the bias voltage is configured to be applied as a gate voltage.

10. The amplification apparatus according to claim 1, wherein
the first current source is a fifth transistor,
the third current source is a sixth transistor, and
a proportion between a ratio of a gate width to a gate length of the fifth transistor and a ratio of a gate width to a gate length of the sixth transistor is equal to a proportion between a ratio of a gate width to a gate length of the first transistor and a ratio of a gate width to a gate length of the third transistor.

11. The amplification apparatus according to claim 1, wherein
the first current source includes fifth transistors connected in series, and
the third current source includes sixth transistors connected in series.

12. The amplification apparatus according to claim 1, wherein
the amplification circuit comprises:
a first source follower stage to which a first input signal is configured to be inputted, the first source follower stage being defined as the source follower stage, the first input signal being defined as the input signal; and
a second source follower stage to which a second input signal is configured to be inputted, the second source follower stage being defined as an additional source follower stage, the second input signal being defined as an additional input signal, wherein
the amplification stage comprises:
a pair of fourth transistors configured to perform differential amplification, the pair of fourth transistors being defined as the fourth transistor and an additional fourth transistor; and
a tail current transistor that is a MOSFET as a tail current source and has a drain connected to sources of the pair of fourth transistors, and
a source of the second transistor is connected to the sources of the pair of fourth transistors.

13. A bias circuit for supplying a bias voltage to an amplification circuit, the amplification circuit including a first amplification transistor being a MOSFET with a first polarity and a second amplification transistor being a MOSFET with a second polarity different from the first polarity, the bias circuit comprising:
a first voltage outputting unit comprising:
a first current source configured to increase and decrease a first output current depending on the bias voltage; and
a first voltage dropping portion including a first transistor which is a MOSFET with the first polarity and through which the first output current from the first current source flows as a drain current,
the first voltage outputting unit being configured to output a first output voltage from a connection point between the first current source and the first voltage dropping portion;
a second voltage outputting unit comprising:
a second current source configured to output a constant current as a second output current; and
a second voltage dropping portion including a second transistor which is a MOSFET with the second polarity and through which the second output current from the second current source flows as a drain current,
the second voltage outputting unit being configured to output a second output voltage from a connection point between the second current source and the second voltage dropping portion; and
a voltage comparator configured to output the bias voltage to the amplification circuit and the first current source, and increase and decrease the bias voltage such that the first and second output voltages become equal, based on a difference between the first and second output voltages.

* * * * *